United States Patent
Komine et al.

(10) Patent No.: US 8,098,532 B2
(45) Date of Patent: Jan. 17, 2012

(54) NON-VOLATILE SEMICONDUCTOR STORAGE DEVICE WITH ADDRESS SEARCH CIRCUIT USED WHEN WRITING

(75) Inventors: Yuji Komine, Tokyo (JP); Shinya Fujisawa, Tokyo (JP); Yasuhiko Honda, Hiratsuka (JP); Ryu Hondai, Yokohama (JP); Takamichi Kasai, Yokohama (JP); Takahiro Suzuki, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 537 days.

(21) Appl. No.: 12/273,813

(22) Filed: Nov. 19, 2008

(65) Prior Publication Data

US 2009/0129156 A1   May 21, 2009

(30) Foreign Application Priority Data

Nov. 20, 2007 (JP) ................................ 2007-300800
Jun. 20, 2008 (JP) ................................ 2008-162189

(51) Int. Cl.
*G11C 7/10* (2006.01)
(52) U.S. Cl. ............ 365/189.05; 365/49.17; 365/185.03
(58) Field of Classification Search ...... 365/49.1–49.17, 365/230.08, 189.05; 711/102, 103
See application file for complete search history.

(56) References Cited

U.S. PATENT DOCUMENTS

| | | | | |
|---|---|---|---|---|
| 5,563,828 A * | 10/1996 | Hasbun et al. | ........... | 365/185.33 |
| 6,166,938 A * | 12/2000 | Wong | ........................... | 365/49.1 |
| 6,636,437 B2 * | 10/2003 | Kobayashi et al. | ...... | 365/185.03 |
| 6,650,561 B2 * | 11/2003 | Batson et al. | ................ | 365/49.1 |
| 7,170,782 B2 | 1/2007 | Conley et al. | | |
| 2006/0155896 A1 | 7/2006 | Lee et al. | | |
| 2007/0035999 A1 | 2/2007 | Kim | | |

FOREIGN PATENT DOCUMENTS

JP         2006-172681         6/2006

OTHER PUBLICATIONS

Pagiamtzis et al. "Content Addressable Memory (CAM) Circuits and Architectures," IEE Journal of Solid-State Circuits, vol. 41, No. 3, Mar. 2006, pp. 712-727.*

* cited by examiner

*Primary Examiner* — Tuan T Nguyen
*Assistant Examiner* — Lance Reidlinger
(74) *Attorney, Agent, or Firm* — Oblon, Spivak, McClelland, Maier & Neustadt, L.L.P.

(57) ABSTRACT

A non-volatile semiconductor storage device includes a memory cell array having a plurality of non-volatile memory cells, an address search circuit which searches for write object data and outputs an address where the write object data is present, when writing data into the non-volatile memory cells, and a control circuit which exercises control to write the write object data into the non-volatile memory cells in accordance with the address output from the address search circuit.

11 Claims, 22 Drawing Sheets

| DATA PATT SEL SIGNAL[1:0] | | |
|---|---|---|
| 0 | 0 | DATA (00) WRITING |
| 0 | 1 | DATA (01) WRITING |
| 1 | 0 | DATA (10) WRITING |
| 1 | 1 | STATE MULTI WRITING (NOT SET WHEN USING DATA CONVERSION CIRCUIT) |

FIG. 2

MULTI-VALUE COMPRESSED PAIR

Page 0 | IO<0> | IO<1> | IO<2> | ••• | IO<15> |

Page 8 | IO<0> | IO<1> | IO<2> | ••• | IO<15> |

FIG. 3

WHEN DATA PATTERN SELECTION SIGNAL IS "00" OR "10"

(a)

DATA CONVERSION CIRCUIT INPUT

| UB | LB |
|---|---|
| 0 | 0 |
| 0 | 1 |
| 1 | 0 |
| 1 | 1 |

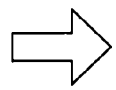

DATA CONVERSION CIRCUIT OUTPUT

| UB | LB |
|---|---|
| 0 | 1 |
| 1 | 1 |
| 1 | 0 |
| 1 | 1 |

WHEN DATA PATTERN SELECTION SIGNAL IS "01"

(b)

DATA CONVERSION CIRCUIT INPUT

| UB | LB |
|---|---|
| 0 | 0 |
| 0 | 1 |
| 1 | 0 |
| 1 | 1 |

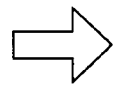

DATA CONVERSION CIRCUIT OUTPUT

| UB | LB |
|---|---|
| 1 | 1 |
| 0 | 1 |
| 1 | 1 |
| 1 | 1 |

FIG. 4

RowDEC 0 TO 15 ARE DECODED WITH COLUMN ADDRESS B[4:1] BIT

| MODE VERIFY | DATA PATTERN SELECTION SIGNAL [1:0] | | UBEN1 | LBEN1 | UBEN2 | LBEN2 | |
|---|---|---|---|---|---|---|---|
| 0 | 0 | 0 | 1 | 1 | 1 | 0 | AT TIME OF (00) WRITE, OR DATA TRANSFER FROM FIRST DATA BUFFER TO SECOND DATA BUFFER |
| 0 | 0 | 1 | 1 | 1 | 1 | 0 | AT TIME OF (01) WRITE, OR DATA TRANSFER FROM FIRST DATA BUFFER TO SECOND DATA BUFFER |
| 0 | 1 | 0 | 1 | 1 | 0 | 1 | AT TIME OF (10) WRITE, OR DATA TRANSFER FROM FIRST DATA BUFFER TO SECOND DATA BUFFER |
| 0 | 1 | 1 | 1 | 1 | 1 | 1 | STATE MULTI WRITE |
| 1 | 0 | 0 | 1 | 0 | 1 | 0 | (00) VERIFY |
| 1 | 0 | 1 | 1 | 0 | 1 | 0 | (01) VERIFY |
| 1 | 1 | 0 | 0 | 1 | 0 | 1 | (10) VERIFY |
| 1 | 1 | 1 | NOT USED | | | | UNUSED |

FIG. 6

| PRGPTN[1:0] | PRGPTN1XB | PRGPTN10 | PRGPTN00 |
|---|---|---|---|
| 0  0 | 1 | 0 | 1 |
| 0  1 | 1 | 0 | 0 |
| 1  0 | 0 | 1 | 0 |
| 1  1 | 0 | 0 | 0 |

1

NON-VOLATILE SEMICONDUCTOR STORAGE DEVICE WITH ADDRESS SEARCH CIRCUIT USED WHEN WRITING

CROSS-REFERENCE TO RELATED APPLICATION

This application is based upon and claims the benefit of priority from prior Japanese Patent Applications No. 2007-300800 and No. 2008-162189 filed on Nov. 20, 2007 and Jun. 20, 2008 in Japan, the entire contents of which are incorporated herein by reference.

BACKGROUND OF THE INVENTION

1. Field of the Invention

The present invention relates to a non-volatile semiconductor storage device.

2. Related Background Art

As for non-volatile semiconductor devices represented by flash memories, there are generally automatic word write operation which makes it possible to write data into memory cells with a word taken as the unit, and automatic page write operation which makes it possible to write a plurality of words in order to shorten the write time (see, for example, JPA 2006-172681 (KOKAI)).

As the capacity of the non-volatile semiconductor storage device becomes large in recent years, the number of words which can be written by performing the automatic page write operation once is also increased from 8 words, 16 words or 32 words in the past to 256 words or 512 words in order to shorten the whole write time.

In the automatic page write operation, for example, the 8-word automatic page write operation of a conventional non-volatile semiconductor storage device, 4-page data decoded with a page address is first output from a data buffer and written. If write time of a head page is finished, then an address generation circuit increases the address by +4 to shift the page address to a next data area corresponding to four pages. The next write data is read out from the data buffer, and write operation is performed in the same way.

SUMMARY OF THE INVENTION

A non-volatile semiconductor storage device according to an embodiment includes: a memory cell array configured to include a plurality of non-volatile memory cells; an address search circuit configured to search for write object data and output an address where the write object data is present, when writing data into the non-volatile memory cells; a control circuit configured to exercise control to write the write object data into the non-volatile memory cells in accordance with the address output from the address search circuit; and a data buffer configured to retain input data and have a decision function of making a decision whether the write object data is present in the input data, wherein on the basis of a result of the decision made by the data buffer, the address search circuit outputs the address where the write object data is present.

BRIEF DESCRIPTION OF THE DRAWINGS

FIG. 2 is a diagram showing a multi-value compressed pair;

FIG. 3 is a diagram for explaining a data pattern selection signal;

FIGS. 4(a) and 4(b) are diagrams for explaining data conversion in a data conversion circuit;

FIG. 6 is a diagram for explaining relations between a control signal and an operation mode;

DETAILED DESCRIPTION OF THE INVENTION

In the case where write data are not present, i.e., in the case where writing is not performed because write data is not present, a write time which is as long as that taken when write data is present is caused to elapse and then the address is increased by +4, in the conventional automatic page write operation. After writing is performed for all pages, the address is returned to the head address at which page writing is to be performed and a shift to the verify operation is performed. In this verify operation as well, the address increase operation occurs each time regardless of whether write data is present.

When the number of pages is small, total write operation time is not influenced so much even if increments of all page addresses are inserted regardless of whether write data is present. When the number of pages has become large, however, the influence becomes nonnegligible, resulting in a prolonged total write operation time.

In the conventional automatic erase operation mode as well, the page address increase operation occurs each time regardless of whether there is an object bit in, for example, erase verify operation, excessive erase verify operation and excessive erase cell rewrite operation, resulting in a problem of prolonged total erase operation time.

As regards the problems found by the present inventors, embodiments of the present invention will be described in detail hereafter with reference to the drawings.

First Embodiment

Figure 1:
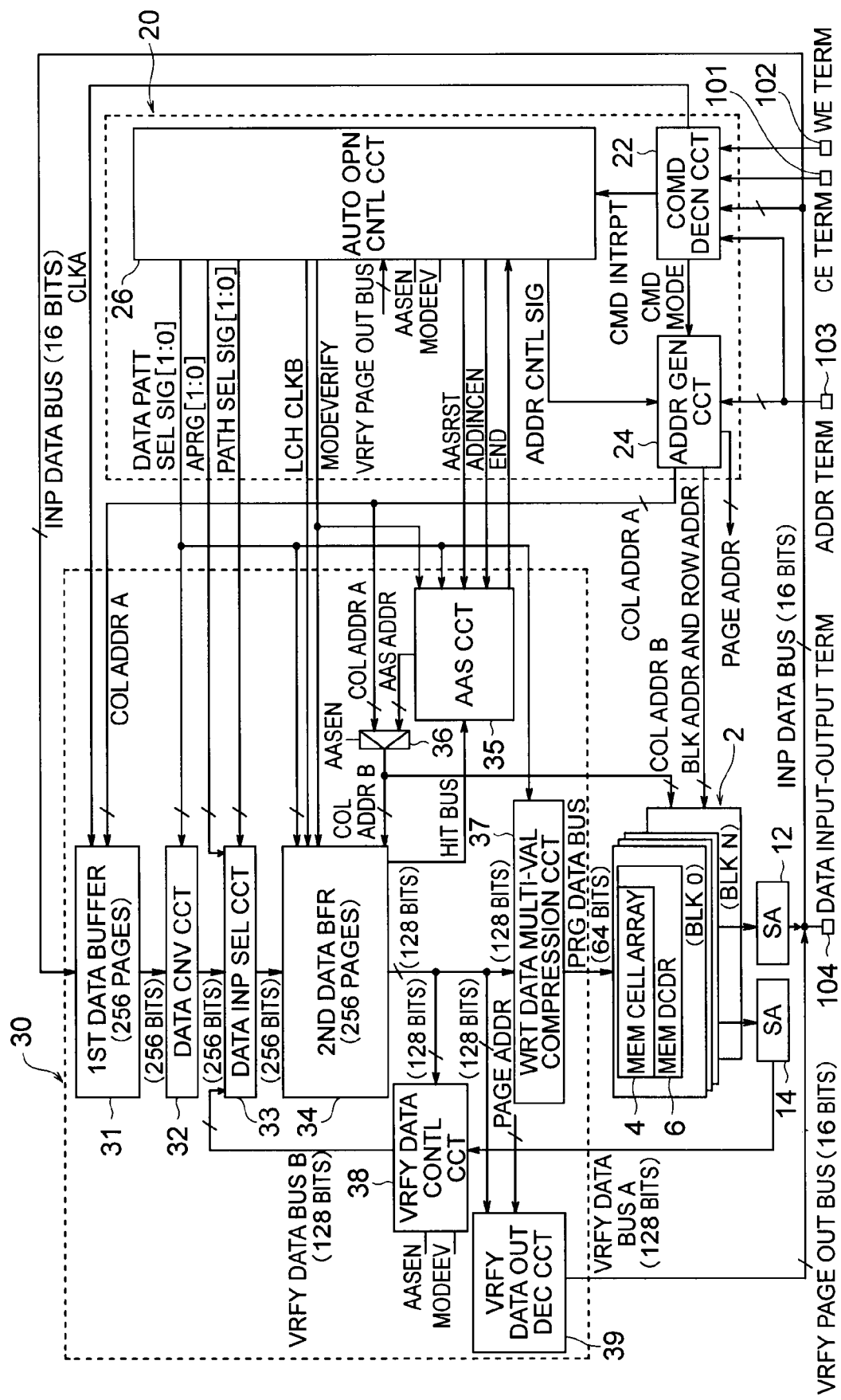
FIG. 1 is a block diagram showing a non-volatile semiconductor storage device according to a first embodiment.

A non-volatile semiconductor storage device according to a first embodiment of the present invention is shown in FIG. 1. A non-volatile semiconductor storage device according to the present embodiment includes a plurality of memory blocks 2, a reading sense amplifier circuit 12, an automatic operation sense amplifier circuit 14, an automatic operation control system 20, a data control system 30, a CE terminal 101, a WE terminal 102, an address input terminal 103, and a data input-output terminal 104 via which 16-bit data can be input and output simultaneously.

Each of the memory blocks 2 includes a memory cell array 4 and a memory decoder 6 provided around the memory cell array 4. The memory decoder 6 is, for example, a row decoder, a column decoder or the like. The memory cell array 4 includes a plurality of memory cells arranged in a matrix form. Each of the memory cells can store, for example, four-value data.

In the present embodiment, the non-volatile semiconductor storage device is a NOR type flash memory. Each memory cell includes a source region and a drain region formed on a semiconductor substrate at a distance from each other, a tunnel insulation film formed on a region of the semiconductor substrate to serve as a channel between the source region and the drain region, a floating gate formed on the tunnel insulation film, an inter-electrode insulation film formed on the floating gate, and a control gate formed on the inter-electrode insulation film.

Electrons from the semiconductor substrate are injected into the floating gate through the tunnel insulation film and stored therein by applying a high positive voltage to the control gate and the drain region and providing the source region and the semiconductor substrate with a ground potential. As a result, a threshold of the memory cell changes. In the present embodiment, the four-value data is represented as data (11), (10), (00) and (01) in the order of increasing threshold. In other words, the data (11) represents a state in which electrons are not stored in the floating gate (erased state).

The automatic operation control system 20 includes a command decision circuit 22, an address generation circuit 24, and an automatic operation control circuit 26.

The data control system 30 includes a first data buffer 31 capable of retaining data of 256 pages, a data conversion circuit 32, a data input selection circuit 33, a second data buffer 34 including a data retaining circuit capable of retaining data of 256 pages and a data decision circuit, an automatic address search circuit 35 (hereafter referred to as AAS circuit 35) which automatically searches for an address where write data is present and outputs the address, an address selection circuit 36, a write data multi-value compression circuit 37, a verify data control circuit 38, and a verify data output decode circuit 39.

Automatic Write Operation

A configuration and operation of the non-volatile semiconductor storage device according to the present embodiment will now be described by taking an automatic page write operation as an example. As an example of the automatic page write operation, a control sequence of performing writing and verification of the data (10), subsequently performing writing and verification of the data (00), and finally performing writing and verification of the data (01) will now be described.

First, a chip enable signal is input from the CE terminal 101 to start the non-volatile semiconductor storage device. It is supposed that memory cells in the region of the memory cell array 4 to be subjected to automatic page write operation are in the erased state (data (11)) before the automatic page write operation is performed.

Subsequently, an automatic page write command is input from the address terminal 103 and the data input-output terminal 104. Thereupon, the command decision circuit 22 recognizes the automatic page write operation, and outputs a command interrupt signal to the automatic operation control circuit 26 to notify it of a control start of the automatic page write operation.

Subsequently, a write address and write data are input from the address terminal 103 and the data input-output terminal 104. Thereupon, a head address of a write address is latched in the address generation circuit 24 by an address control signal input from the automatic operation control circuit 26. In addition, a column address A for storing write data is output to the first data buffer 31 in the data control system 30.

The write data is sent to a region of the first data buffer 31 indicated by the column address A, via an input data bus by a pulse of a latch clock CLKA generated by the command decision circuit 22 every command input, and latched. The column address A is automatically incremented every data latch.

If write data of all pages have been stored in the first data buffer 31, then the address generation circuit 24 indicates a block address, a row address and a head page address which becomes an object of the page write, in the column address A. Data Page 0 to Page 255 of 256 pages are stored in the first data buffer 31. Each page is formed of 16 bits.

In order to search for data (10) to be written from write data stored in the first data buffer 31, the stored write data are converted by the data conversion circuit 32. Data obtained by the conversion in the data conversion circuit 32 are stored in a retention circuit in the second data buffer 34 via the data input selection circuit 33. This data conversion is performed as described hereafter.

Since the data to be written (write object data) is data (10), a data pattern selection signal [1:0] sent from the automatic operation control circuit 26 to the data conversion circuit 32 is set to "10". If the data to be written is data (00) or data (01), then the data pattern selection signal [1:0] becomes "00" or "01" respectively as shown in FIG. 2. If the data pattern selection signal [1:0] is "11", then it corresponds to state multi write described later.

On the other hand, a data group corresponding to 16 pages (256 bits) is sent from the first data buffer 31 via a data bus by performing transfer once. This transfer is performed 16 times. In other words, a data group Page 0 to Page 15 is sent, and then a data group Page 16 to Page 31 is sent. After this data transfer is performed 15 times, a data group Page 240 to Page 255 is finally sent to the data conversion circuit 32.

A data group of a former half corresponding to 8 pages included in the data group sent from the first buffer circuit 31 by performing the transfer once is referred to an upper bit data group. A data group of a latter half corresponding to 8 pages is referred to a lower bit data group. For example, if the data group sent by performing the transfer once is Page 0 to Page 15, then the upper bit data group becomes a data group Page 0 to Page 7 and the lower bit data group becomes a data group Page 8 to Page 15.

A pair of data having the same order in, for example, the upper bit data group Page 0 to Page 7 and the lower bit data group Page 8 to Page 15 sent by performing the transfer once, for example, a pair of the data Page 0 and the data Page 8 is referred to as "multi-value compressed pair." Therefore, a pair of the data Page 1 and the data Page 9 also becomes a multi-value compressed pair, and a pair of the data Page 2 and the data Page 10 also becomes a multi-value compressed pair.

Furthermore, a pair of the data Page 241 and the data Page 249 also becomes a multi-value compressed pair, and a pair of the data Page 248 and the data Page 255 also becomes a multi-value compressed pair. Data contained in an upper bit data group in a multi-value compressed pair is referred to as upper bit data, and data contained in a lower bit data group in the multi-value compressed pair is referred to as lower bit data.

Since the multi-value compressed pair, for example, the data Page 0 and Page 8 each is 16-bit data, 16 binary bits IO<0>, IO<1>, . . . , IO<15> are included as shown in FIG. 3. Each IO<i> (i=0, . . . , 15) represents a binary bit input from an ith input-output terminal 104.

Binary bits input from the same input-output terminal for the upper bit data and the lower bit data in a multi-value compressed pair are referred to as upper bit (hereafter referred to as UB as well) and lower bit (hereafter referred to as LB as well), respectively. These bits are referred to as "multi-value compressed bit pair."

If the data pattern selection signal is "00" or "10", then the data conversion circuit 32 changes bit values of upper bit data and lower bit data in a multi-value compressed bit pair which is output by combining an upper bit and a lower bit constituting a multi-value compressed bit pair in a multi-value compressed pair in a data group input to the data conversion circuit 32 as shown in FIG. 4(a), and outputs a result.

For example, when an upper bit UB of an input multi-value compressed bit pair is "0" and a lower bit LB of the pair is "0", the upper bit UB in the multi-value compressed bit pair to be output is set equal to "0" without being changed and the lower bit LB in the multi-value compressed bit pair to be output is changed to "1". When the upper bit UB of the input multi-value compressed bit pair is "0" and the lower bit LB of the pair is "1", the upper bit UB in the multi-value compressed bit pair to be output is changed to "1" and the lower bit LB in the multi-value compressed bit pair to be output is set equal to "1" without being changed.

When the upper bit UB of the input multi-value compressed bit pair is "1" and the lower bit LB of the pair is "0", the upper bit UB and the lower bit LB in the multi-value compressed bit pair to be output are not changed. When the upper bit UB of the input multi-value compressed bit pair is "1" and the lower bit LB of the pair is "1", the upper bit UB and the lower bit LB in the multi-value compressed bit pair to be output are not changed, either.

In other words, if the data pattern selection signal is "00" or "10" (if data to be written is (00) or (10)), then only the lower bit LB in the multi-value compressed bit pair to be output is changed to "1" and a resultant multi-value compressed bit pair is output, when the upper bit UB and the lower bit LB in the input multi-value compressed bit pair are "0" and "0", respectively. When the upper bit UB and the lower bit LB in the input multi-value compressed bit pair are "0" and "1", respectively, only the upper bit UB in the multi-value compressed bit pair to be output is changed to "1" and a resultant multi-value compressed bit pair is output. When the input multi-value compressed bit pair has other values, the upper bit UB and the lower bit LB in the multi-value compressed bit pair to be output are not changed and a resultant multi-value compressed bit pair is output.

If the data pattern selection signal is "01", then bit values of upper bit data and lower bit data in a multi-value compressed bit pair which is output by combining an upper bit UB and a lower bit LB constituting a multi-value compressed bit pair in a multi-value compressed pair in a data group input to the data conversion circuit 32 are changed as shown in FIG. 4(b), and a resultant multi-value compressed bit pair is output.

In other words, if the data pattern selection signal is "01" (if data to be written is (01)), then an upper bit UB and a lower bit LB in a multi-value compressed bit to be output are not changed and a resultant multi-value compressed bit pair is output, when the upper bit UB and the lower bit LB in the input multi-value compressed bit pair are "0" and "1", respectively, or "1" and "1", respectively. When the upper bit UB and the lower bit LB in the input multi-value compressed bit pair are "0" and "0", respectively, the upper bit UB and the lower bit LB in the multi-value compressed bit pair to be output are changed to "1" and a resultant multi-value compressed bit pair is output. When the upper bit UB and the lower bit LB in the input multi-value compressed bit pair are "1" and "0", respectively, the upper bit UB in the multi-value compressed bit pair to be output is set equal to "1" without being changed and the lower bit LB in the multi-value compressed bit pair is changed to "1" and a resultant multi-value compressed bit pair is output.

The reason why such data conversion is performed is that information of object bits the data (00) and the data (10) is needed to implement state multi write operation which will be described later and a configuration of the decision circuit in the second data buffer 34 should be simplified. In other words, if the multi-value compressed bit pair (00) is output as (00) after the conversion, logics for distinguishing the data (10) and the data (00) in the data decision circuit increase.

Data obtained by such conversion are transferred to the second data buffer 34 via the data input selection circuit 33. The data input selection circuit 33 selects either the data group transferred from the first data buffer 31 via the data conversion circuit 32 or the data group transferred from the verify data control circuit 38 on the basis of a path selection signal [1:0] or a signal APRG [1:0] sent from the automatic operation control circuit 26, and transfers the selected data group to the second data buffer 34.

A data group corresponding to 16 pages (256 bits) is sent via a data bus by performing transfer once. This transfer is performed 16 times. In other words, the data group Page 0 to Page 15 converted by the data conversion circuit 32 is sent, and then the data group Page 16 to Page 31 is sent. After this data transfer is performed 15 times, the data group Page 240 to Page 255 is finally sent from the data conversion circuit 32.

When latching data from the data conversion circuit 32 in the second data buffer 34, a latch address supplied to the second data buffer 34 is incremented via the column address A→a column address B (AASEN=0) such as column address A[4:1]=0000 for Page 0 to Page 15, column address A[4:1]=0001 for Page 16 to Page 31, and column address A[4:1]=1111 for Page 240 to Page 255. Since Page 0 to Page 15 are latched simultaneously at a time, A[0] becomes "Don't Care".

Figure 5:
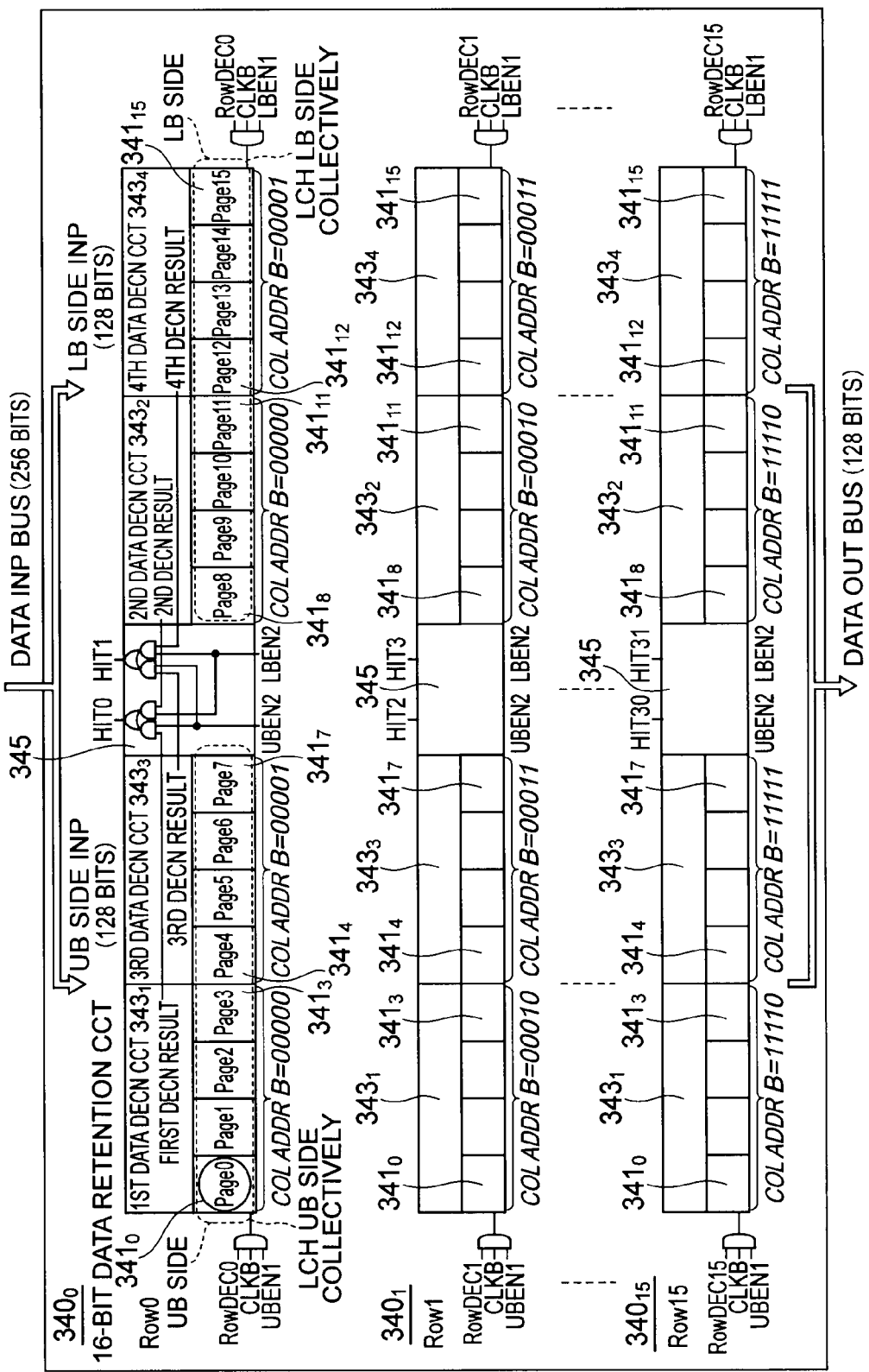
FIG. 5 is a block diagram showing a configuration of a concrete example of a second data buffer.

A configuration of a concrete example of the second data buffer 34 is shown in FIG. 5. The second data buffer 34 includes sixteen data buffer circuits $340_0$ to $340_{15}$. Each data buffer circuit $340_i$ (i=0, . . . , 15) includes sixteen data retention circuits $341_0$ to $341_{15}$, first to fourth data decision circuits $343_1$, $343_2$, $343_3$ and $343_4$, and a decision result output circuit 345. Each data retention circuit $341_i$ (i=0, . . . , 15) can retain 16-bit data.

The data group Page 0 to Page 15 sent from the data conversion circuit 32 in first transfer are stored in the data retention circuits $341_0$ to $341_{15}$ in the data buffer circuit $340_0$, respectively. The data group Page (16×(i−1)) to Page (16×i−1)) sent from the data conversion circuit 32 in the ith (i=1, . . . , 16) transfer are stored in the data retention circuits $341_0$ to $341_{15}$ in the data buffer circuit $340_i$, respectively.

Selection of the data buffer circuit $340_i$ (i=0, . . . , 15) is performed on the basis of a decode signal RowDECi obtained by decoding the column address B sent from the address selection circuit 36. Storage of data is performed on the basis of a latch pulse CLKB sent from the automatic operation control circuit 26 and control signals UBEN1 and LBEN1. As shown in FIG. 5, a column address B of a data group retained in the data retention circuits $341_0$ to $341_3$ and the data retention circuits $341_8$ to $341_{11}$ is an address of data to be written into a memory cell array, and becomes "00000". A column address B of a data group retained in the data retention circuits $341_4$ to $341_7$ and the data retention circuits $341_{12}$ to $341_{15}$ becomes "00001".

A first data decision circuit $343_1$ makes a decision whether data to be written (i.e., data "0") is present on the basis of a data group retained in the data retention circuit $341_0$ to $341_3$ in a data buffer circuit in which the first data decision circuit $343_1$ is included.

A second data decision circuit $343_2$ makes a decision whether data to be written is present on the basis of a data group retained in the data retention circuit $341_8$ to $341_{11}$ in a data buffer circuit in which the second data decision circuit $343_2$ is included.

A third data decision circuit $343_3$ makes a decision whether data to be written is present on the basis of a data group retained in the data retention circuit $341_4$ to $341_7$ in a data buffer circuit in which the third data decision circuit $343_3$ is included.

A fourth data decision circuit $343_4$ makes a decision whether data to be written is present on the basis of a data group retained in the data retention circuit $341_{12}$ to $341_{15}$ in a data buffer circuit in which the fourth data decision circuit $343_4$ is included.

Each data decision circuit judges that data to be written is not present when each bit in the data group which is the object of the decision is "1". Each data decision circuit judges that data to be written is present when each bit in the data group which is the object of the decision is "0".

A decision result output circuit 345 in the data buffer circuit $340_i$ (i=0, . . . , 15) includes a first AND gate which conducts AND operation on a first data decision result in the first data decision circuit $343_1$ and the control signal UBEN2, a second AND gate which conducts AND operation on a second decision result in the second data decision circuit $343_2$ and the control signal LBEN2, a first OR gate which conducts OR operation on outputs of the first and second AND gates and outputs a first decision signal HIT(2i), a third AND gate which conducts AND operation on a third decision result in the third data decision circuit $343_3$ and the control signal UBEN2, a fourth AND gate which conducts AND operation on a fourth decision result in the fourth data decision circuit $343_4$ and the control signal LBEN2, and a second OR gate which conducts OR operation on outputs of the third and fourth AND gates and outputs a second decision signal HIT (2i+1).

Relations between values of the control signals UBEN1, LBEN1, UBEN2 and LBEN2 and operations are shown in FIG. 6. When a value of a control signal MODEVERIFY shown in FIG. 6 is "0", a write operation or transfer of data from the first data buffer to the second data buffer is performed. When the value of the control signal MODEVERIFY is "1", a verify operation is performed.

If a value of the first decision signal, for example, the first decision signal HIT0 is "1", then it is represented that write data is present in the upper bit data group Page 0 to Page 3 or the lower bit data group Page 8 to Page 11. If the value of the first decision signal HIT0 is "0", then it is represented that write data is not present in the upper bit data group Page 0 to Page 3 and the lower bit data group Page 8 to Page 11. If a value of the second decision signal, for example, the second decision signal HIT1 is "1", then it is represented that write data is present in the upper bit data group Page 4 to Page 7 or the lower bit data group Page 12 to Page 15. If the value of the second decision signal HIT1 is "0", then it is represented that write data is not present in the upper bit data group Page 4 to Page 7 and the lower bit data group Page 12 to Page 15.

The decision signals HIT0 to HIT31 representing whether data to be written is present are output from the second data buffer 34 having the configuration, and sent to the automatic address search circuit 35 (AAS circuit 35).

Figure 7:
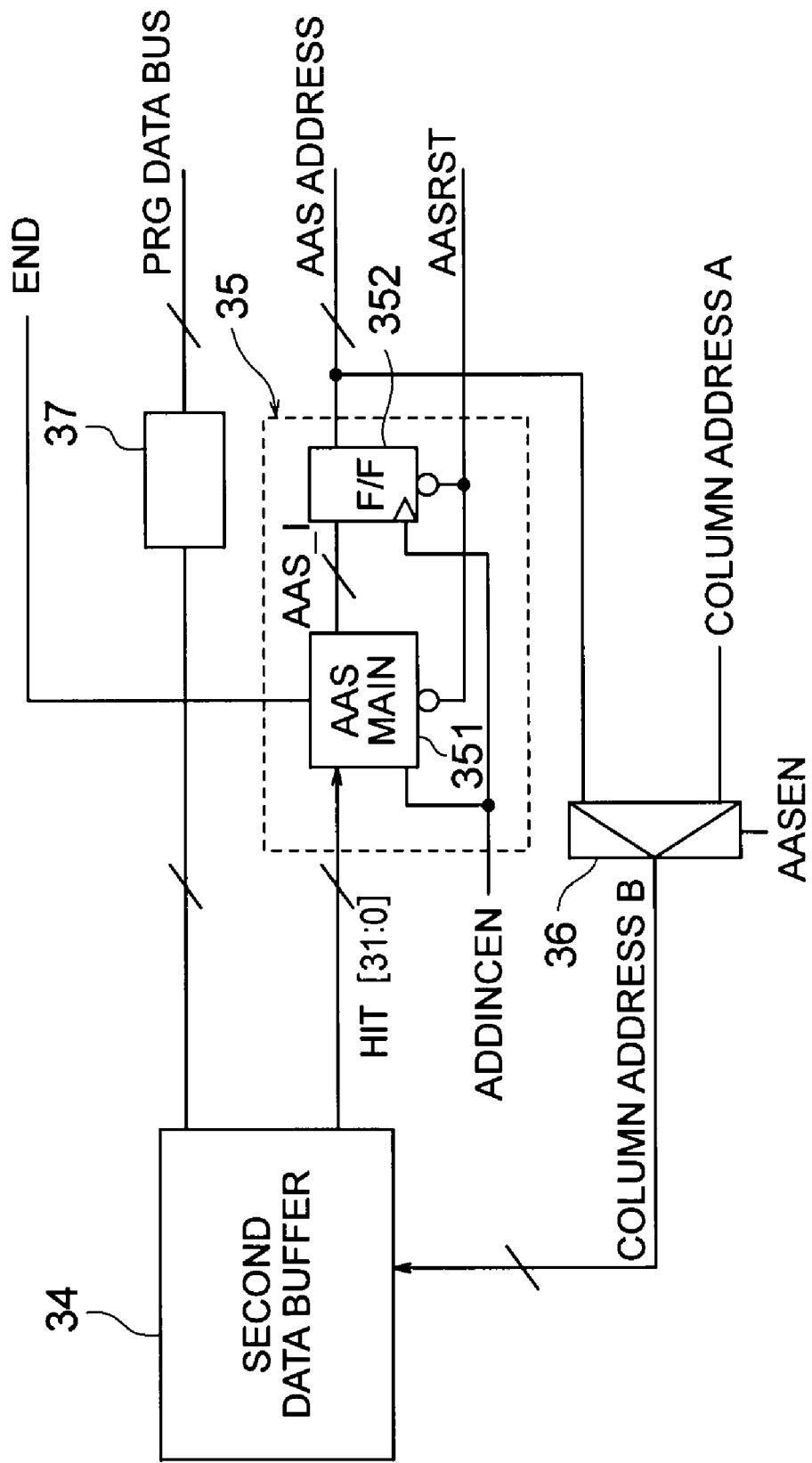
FIG. 7 is a block diagram showing an automatic address retrieval circuit.

The AAS circuit is shown in FIG. 7. The AAS circuit 35 includes an AAS main circuit 351 and a flip-flop 352. The AAS main circuit 351 outputs an output signal AAS_I on the basis of the first and second decision signal HIT0 to HIT31 sent from the second data buffer 34 and a control signal ADDINCEN sent from the automatic operation control circuit 26. The flip-flop 352 operates on the basis of the control signal ADDINCEN, and outputs the output signal AAS_I of the AAS main circuit 351 to the address selection circuit 36 as an AAS address.

Operation of the AAS circuit 35 will now be described. If the transfer of data from the first data buffer 31 to the second data buffer 34 is finished, decision of data is made in the second data buffer 34 and values of the first and second decision signals HIT0 to HIT31 are determined, a control signal AADINCEN is sent from the automatic operation control circuit 26 to the AAS circuit 35 and a value of the control signal AASEN sent to the address selection circuit 36 is set equal to "1".

Thereupon, the AAS circuit operates, and the address selection circuit 36 selects and outputs the AAS address output from the AAS circuit 35. As a result, write operation (hereafter referred to as AAS write operation as well) is performed on the basis of the AAS address output from the AAS circuit 35.

Figure 8:
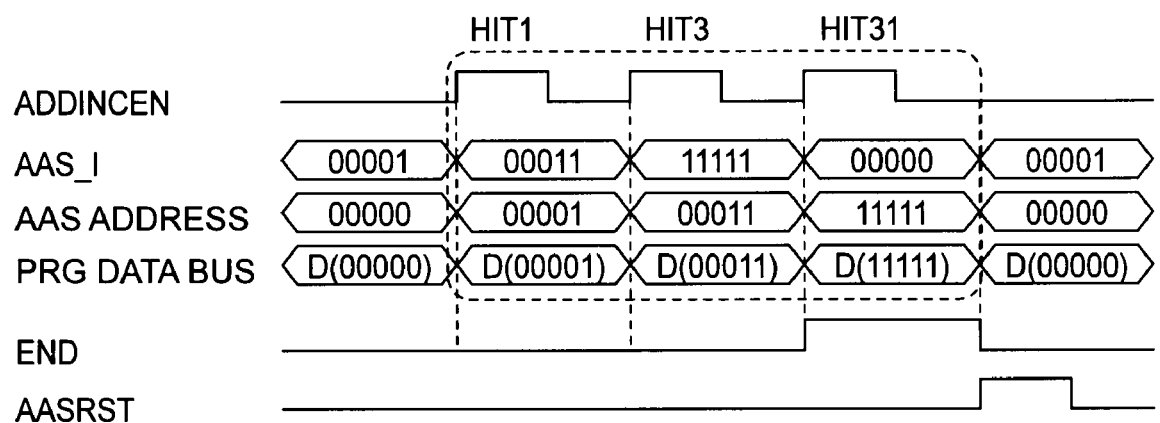
FIG. 8 is a timing diagram of write operation based upon an AAS address in the case where a write object bit is present.

A timing diagram of the write operation based on the AAS address is shown in FIG. 8. In the timing diagram shown in FIG. 8, only the decision signals HIT1, HIT3 and HIT31 indicate that data to be written is present.

At a rising edge of the control signal ADDINCEN, the AAS circuit 35 outputs addresses corresponding to the decision signals HIT0 to HIT31 (an address corresponding to the decision signal HIT1 is "00001" and an address corresponding to the decision signal HIT3 is "00011") as the AAS address. In this example, the address "00001" corresponding to the decision signal HIT1 is first output.

The AAS address is output to the second data buffer 34 and the memory blocks 2 via the address selection circuit 36 as the column address B. For the second data buffer 34, the column address B means an address for outputting write data. For the memory blocks 2, the column address B means an address where data is to be written. The second data buffer 34 outputs a UB side (upper bit side) data Page 4 to Page 7 and an LB side (lower bit side) data Page 12 to Page 15 corresponding to the decision signal HIT1.

Output data from the second data buffer 34 is compressed by the write data multi-value compression circuit 37, and sent to the memory blocks 2 via a PRG data bus. As for writing the data (10), a bit which is 0 in a lower bit LB in a multi-value compressed bit pair is output to the PRC data bus as 1 (write object bit) and writing is performed.

In other words, 128-bit data sent from the second data buffer 34 by performing transfer once are compressed to 64 bits which are half of 128 bits by the multi-value compression circuit 37. After elapse of write time, skipping to the next write address is performed at a rising edge of the control signal ADDINCEN.

For example, in FIG. 8, writing of data (10) is performed in a region of the AAS address corresponding to the decision signal HIT1, then skipping to the AAS address corresponding to the decision signal HIT3, and writing of data (10) is performed in the region of the AAS address. Thereafter, skipping to an AAS address corresponding to the decision signal HIT31 is performed, and writing of data (10) is performed in the region of the AAS address. Successively, writing is performed. When outputting a final AAS address where write data is present, the AAS circuit 35 outputs an END signal to the automatic operation control circuit 26 to indicate that the final AAS address is being executed.

Upon elapse of write time for the final address after receiving the END signal, the automatic operation control circuit 26 generates a control signal AASRST to initialize (reset) the AAS circuit 35. In response to the control signal AASRST, the youngest address having "1" in the value of the decision signal HIT0 to HIT31, i.e., the first address 00001 where write data is present is output as the signal AAS_I, and a shift to a verify mode of the data (10) is made.

Figure 9:
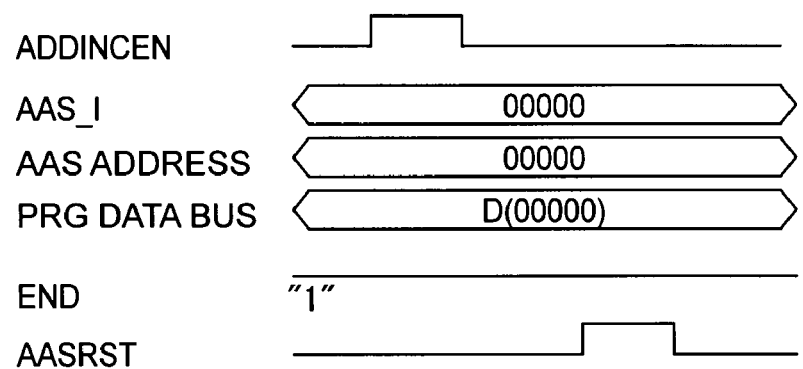
FIG. 9 is a timing diagram of write operation based upon the AAS address in the case where a write object bit is not present.

A waveform diagram in the case where a bit (memory cell) which becomes a write object is not present is shown in FIG. 9.

Figure 10:
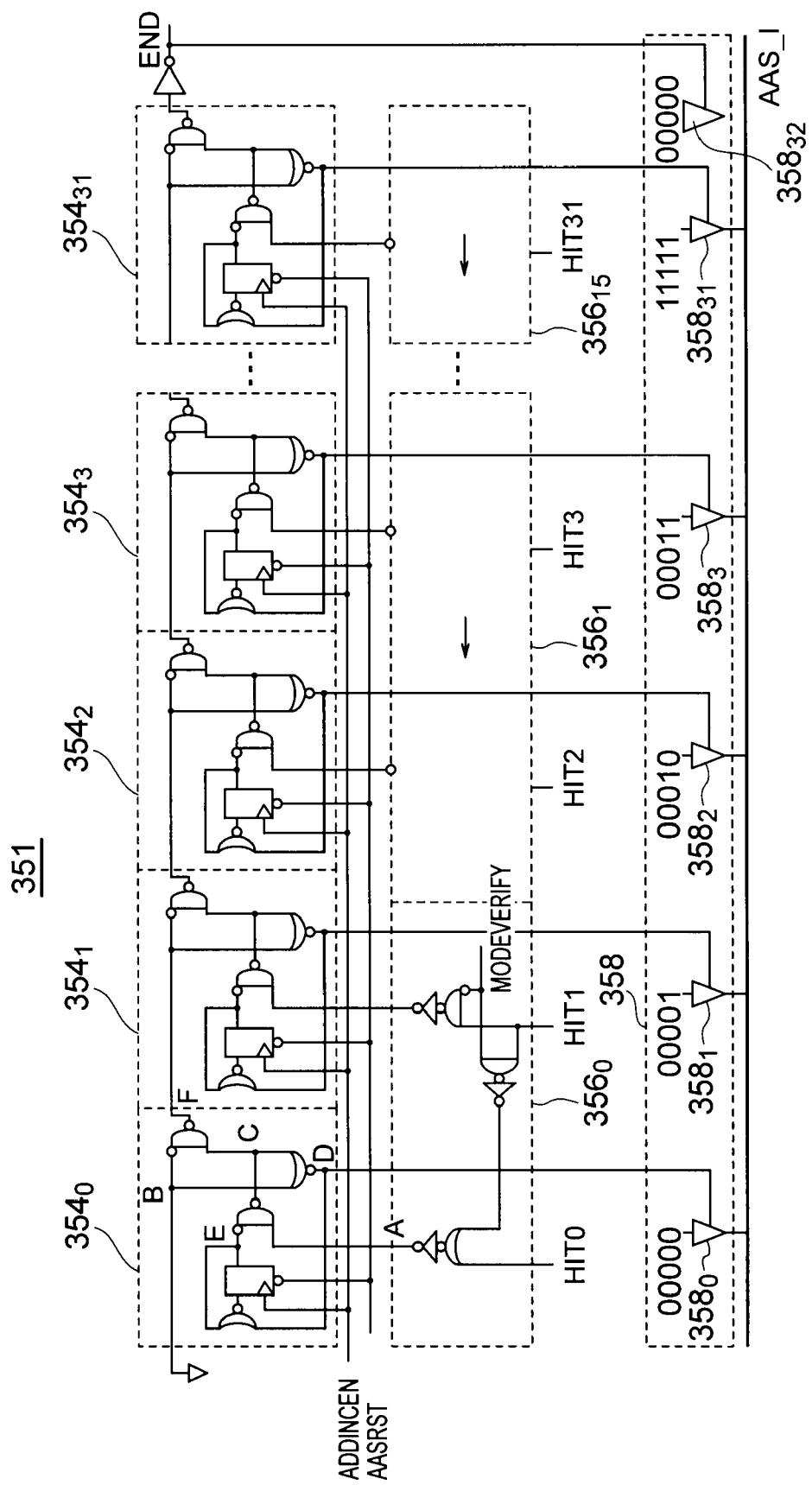
FIG. 10 is a circuit diagram showing a concrete example of an AAS main circuit.

A concrete example of the AAS main circuit 351 which conducts the above-described operation is shown in FIG. 10. The AAS main circuit 351 includes address drivers $354_i$ (i=0, . . . , 31) provided so as to correspond to thirty-two column addresses B, sixteen decision signal decoders $356_i$ (i=0, . . . , 15), and an output driver circuit 358 including thirty-three output drivers $358_i$ (i=0, . . . , 32).

The decision signal decoder $356_i$ (i=0, . . . , 15) includes a first decode circuit which sends out a first decode signal to the address driver $354_{2i}$ on the basis of the decision signals HIT(2i) and HIT(2i+1) and the control signal MODEVERIFY and a second decode circuit which sends out a second decode signal to the address driver $354_{2i+1}$ on the basis of the decision signal HIT(2i+1) and the control signal MODEVERIFY.

The first decode circuit in the decision signal decoder $356_i$ (i=0, . . . , 15) includes a first NAND gate which receives the decision signal HIT(2i+1) and the control signal MODEVERIFY and conducts a NAND operation, a first inverter which inverts an output of the first NAND gate, a NOR gate which receives an output of the first inverter and the decision signal HIT(2i) and conducts a NOR operation, and a second inverter which inverts an output of the NOR gate.

The second decode circuit in the decision signal decoder $356_i$ (i=0, . . . , 15) includes a second NAND gate which receives the inversion signal of the decision signal HIT(2i+1) and the control signal MODEVERIFY and conducts a NAND operation, and a third inverter which inverts an output of the second NAND gate.

Each address driver $354_i$ (i=0, . . . , 31) includes one OR gate, one flip-flop, first and second NAND gates, and one NOR gate. The OR gate in the address driver $354_i$ (i=0, . . . , 31) conducts an OR operation on the basis of an output of the NOR gate and an output of the flip-flop and sends out a result of the operation to the flip-flop. This flip-flop is activated on the basis of the control signal ADDINCEN and reset on the basis of the reset signal AASRST.

The first NAND gate in the address driver $354_{2i}$ (i=0, . . . , 15) conducts a NAND operation on a signal obtained by inverting an output of the flip-flop and an output of the first decode circuit in the decision signal decoder $356_i$, and sends out a result of the NAND operation to first input terminals among first and second input terminals of the second NAND gate and the NOR gate. By the way, "0" is input to a second input terminal of the NOR gate in the address driver $354_0$, and "1" is input to a second input terminal of the second NAND gate in the address driver $354_0$.

A signal obtained by inverting an output of the second NAND gate in the address driver $354_{2i+1}$ is input to the second input terminal of the second NAND gate in the address driver $354_{2i}$ (i=0, . . . , 15). An output of the second NAND gate in the address driver $354_{2i+1}$ is input to the second input terminal of the NOR gate in the address driver $354_{2i}$ (i=0, . . . , 15).

The first NAND gate in the address driver $354_{2i+1}$ (i=0, . . . , 15) conducts a NAND operation on a signal obtained by inverting an output of the flip-flop and an output of the second decode circuit in the decision signal decoder $356_i$, and sends out a result of the NAND operation to first input terminals among first and second input terminals of the second NAND gate and the NOR gate.

A signal obtained by inverting an output of the second NAND gate in the address driver $354_{2i}$ is input to the second input terminal of the second NAND gate in the address driver $354_{2i+1}$ (i=0, . . . , 15). An output of the second NAND gate in the address driver $354_{2i}$ is input to the second input terminal of the NOR gate in the address driver $354_{2i+1}$ (i=0, . . . , 15). A signal obtained by inverting the output of the second NAND gate in the address driver $354_{2i}$ becomes the END signal.

The output driver $358_i$ (i=0, . . . , 31) in the output driver circuit 358 is driven on the basis of the output of the NOR gate in the address driver $354_i$ and outputs a signal AAS_I which becomes the AAS address corresponding to the decision signal HITi. The output driver $358_{32}$ is driven on the basis of the END signal and outputs an AAS_I signal which becomes 00000 in AAS address.

Figure 11:
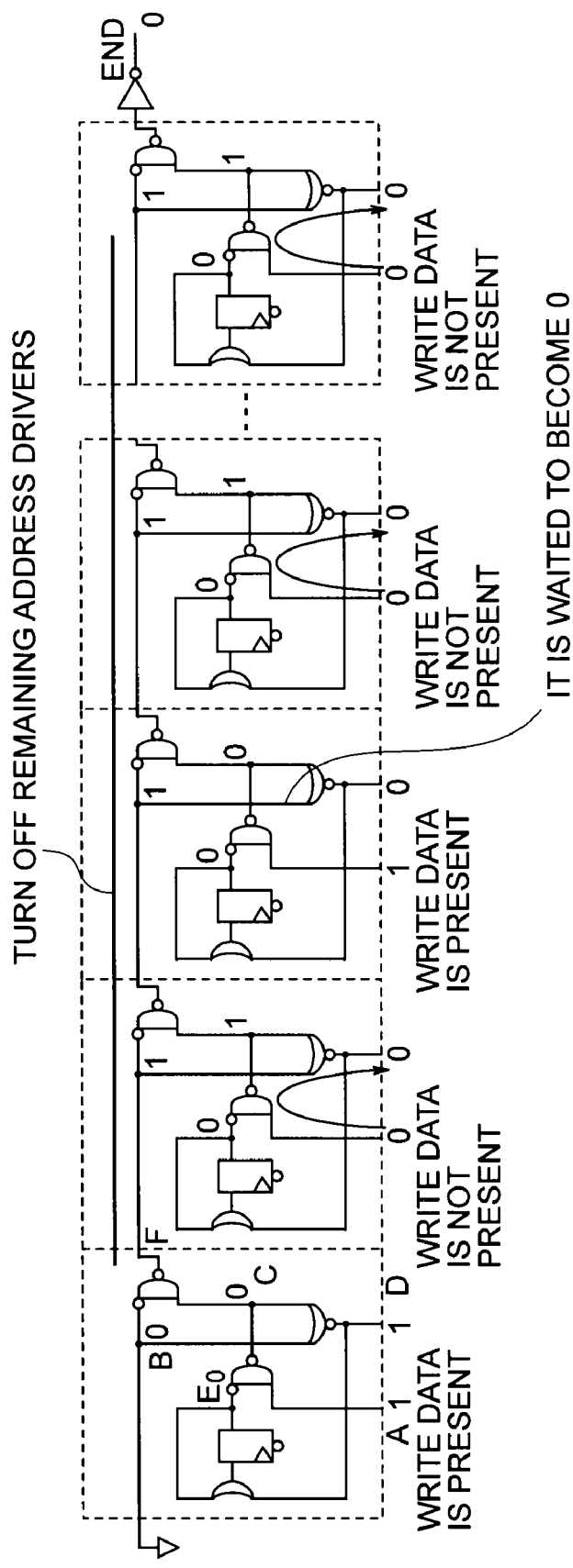
FIG. 11 is a diagram showing a state in which write data is latched in the second data buffer.
Figure 12:
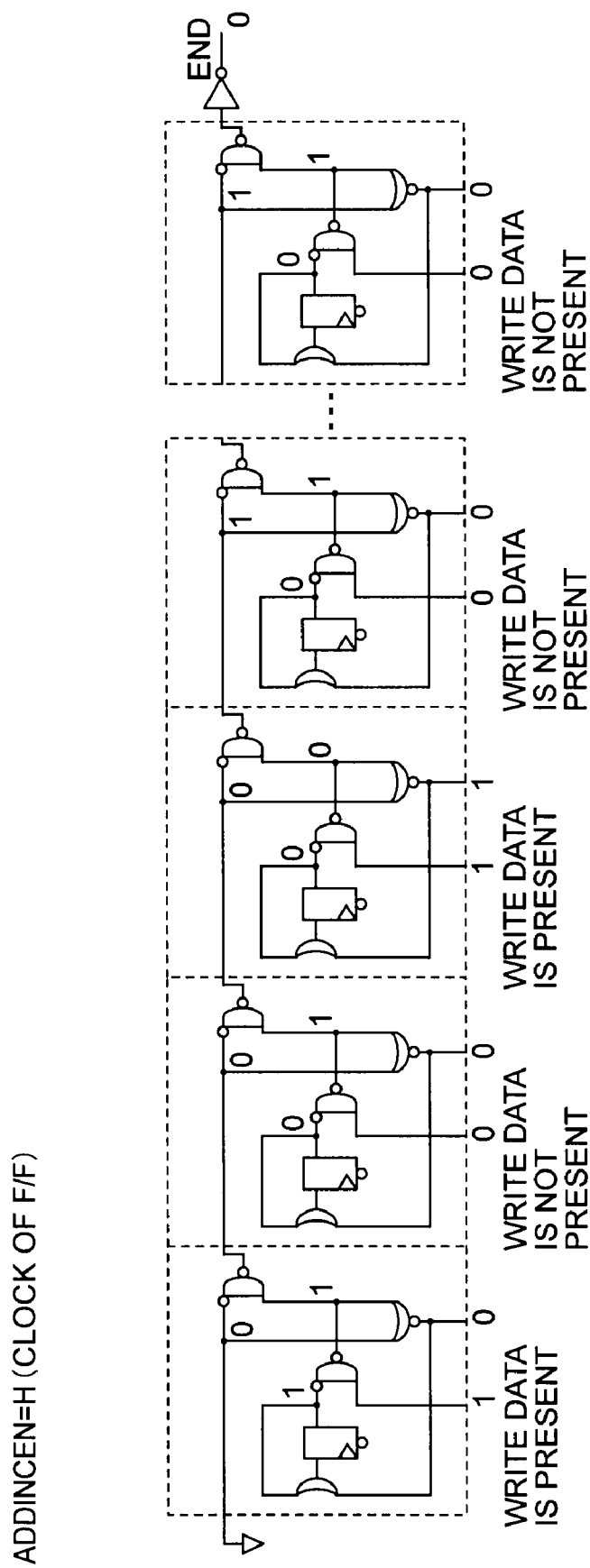
FIG. 12 is a diagram showing a state in which skipping to a next address having data has been performed at a rising edge of a control signal ADDINCEN.
Figure 13:
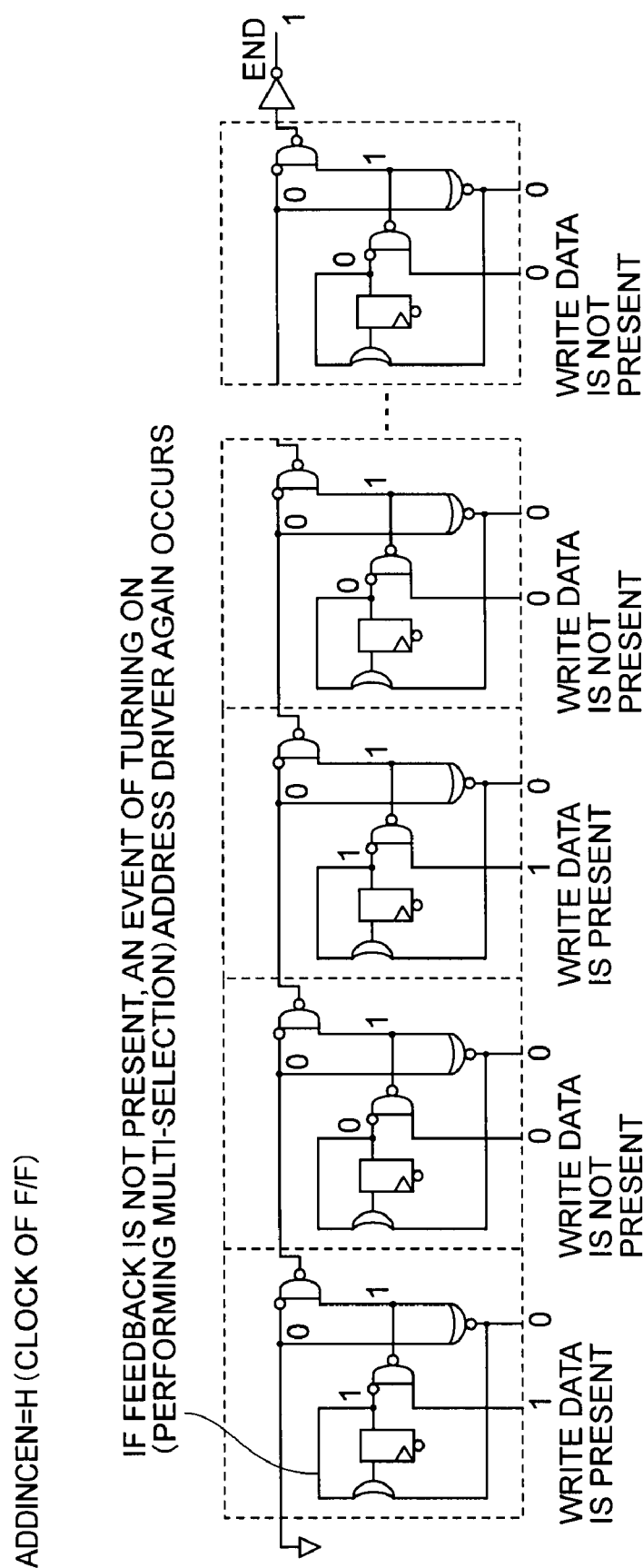
FIG. 13 is a diagram showing a state in which an end signal END is output at the rising edge of the control signal ADDINCEN because there is no address having write data thereafter.

Operation of the AAS main circuit 351 having the configuration is shown in FIGS. 11 to 13. FIG. 11 shows a state in which write data is latched in the second data buffer 34 (a state in which a D output of the leftmost block is "1"). FIG. 12 shows an example in which skipping to a next address (third leftmost block) where write data is present is performed at the rising edge of the control signal ADDINCEN. FIG. 13 shows a state in which the end signal END is output because there is no address where write data is present at the rising edge of the control signal ADDINCEN.

When one of the address drivers is operating, other address drivers are in the off state as appreciated from FIGS. 11 to 13.

Verify Decision Operation of Data (10)

Verify decision operation of data (10) will now be described.

For the verify decision to become OK in the verify of data (10), it is necessary that write data is not present, i.e., all values of the decision signals HIT0 to HIT31 become "0" and the value of the END signal becomes "1". For all values of the decision signals HIT0 to HIT31 become "0", it is necessary that all retained data on the lower bit side (LB side) become 1 in the second data buffer 34 shown in FIG. 5.

Figure 14:
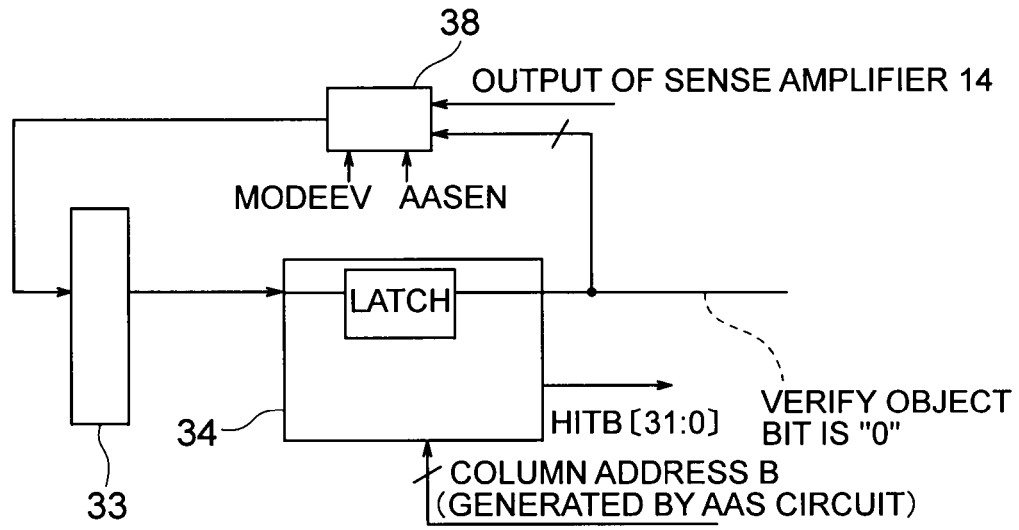
FIG. 14 is a block diagram showing relations between a verify data control circuit and the second data buffer.

As for the verify decision operation of the data (10), data are read out from memory cell arrays 4 by using the automatic operation sense amplifier circuit 14 only in a region found to have write data on the LB side by using the AAS circuit 35. The data thus read out are sent to the verify data control circuit 38. As shown in FIGS. 1 and 14, the verify data control circuit 38 is activated by a control signal MODEEV and the control signal AASEN, and the verify data control circuit 38 makes a verify decision on the basis of the output of the automatic operation sense amplifier circuit 14 and output data corresponding to the AAS address of the second data buffer, and sends a result of the decision to the second data buffer 34 via the input selection circuit 33. By the way, as for output data of the second data buffer, a write object bit is 0 whereas a bit which is not a write object becomes 1.

Figure 15:
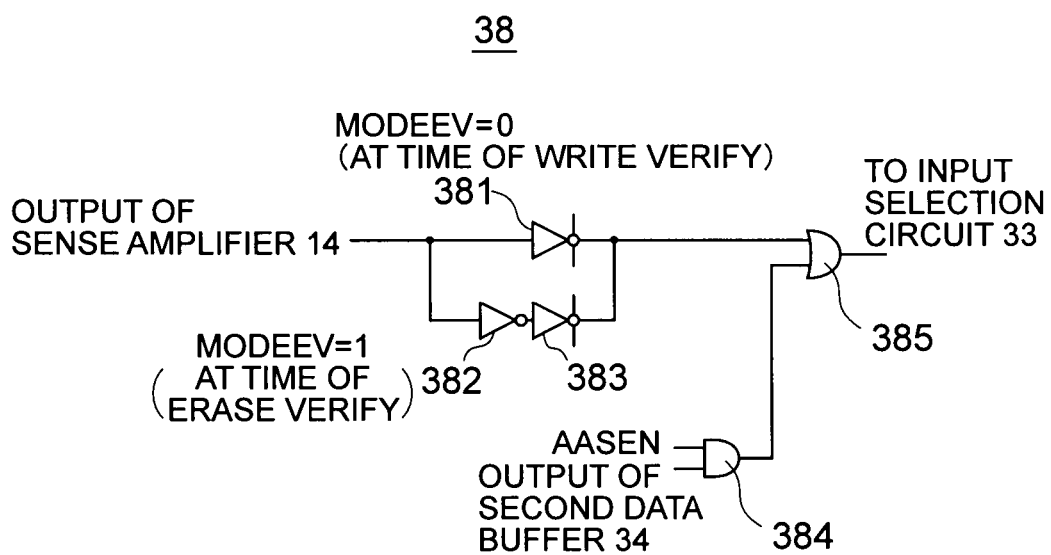
FIG. 15 is a circuit diagram showing a concrete example of the verify data control circuit.

A circuit diagram of a concrete example of the verify data control circuit 38 is shown in FIG. 15. The verify data control circuit 38 in this concrete example includes a clocked inverter 381 which operates at the time of write verify (MODEEV="0") and which inverts the output of the sense amplifier 14, an inverter 382 which inverts the output of the sense amplifier 14, a clocked inverter 383 which operates at the time of erase verify (MODEEV="1") and which inverts the output of the inverter 382, a NAND gate 384 which receives the control signal AASEN and an output of the second data buffer 34, and a NOR gate 385 which receives an output of one of the clocked inverters 381 and 383 and an output of the NAND gate 384.

Whereas a single write operation in the memory blocks 2 is performed with 64 bits, a single verify decision in the verify data control circuit 38 is performed with 128 bits. In other words, when performing the verify decision on the second decision signal HIT1 (AAS address [4:0]=[00001], a verify decision is made on memory cell regions of the first decision signal HIT0 and the second decision signal HIT1 (AAS address [4:0]=[00000]) at a time.

Figure 16:
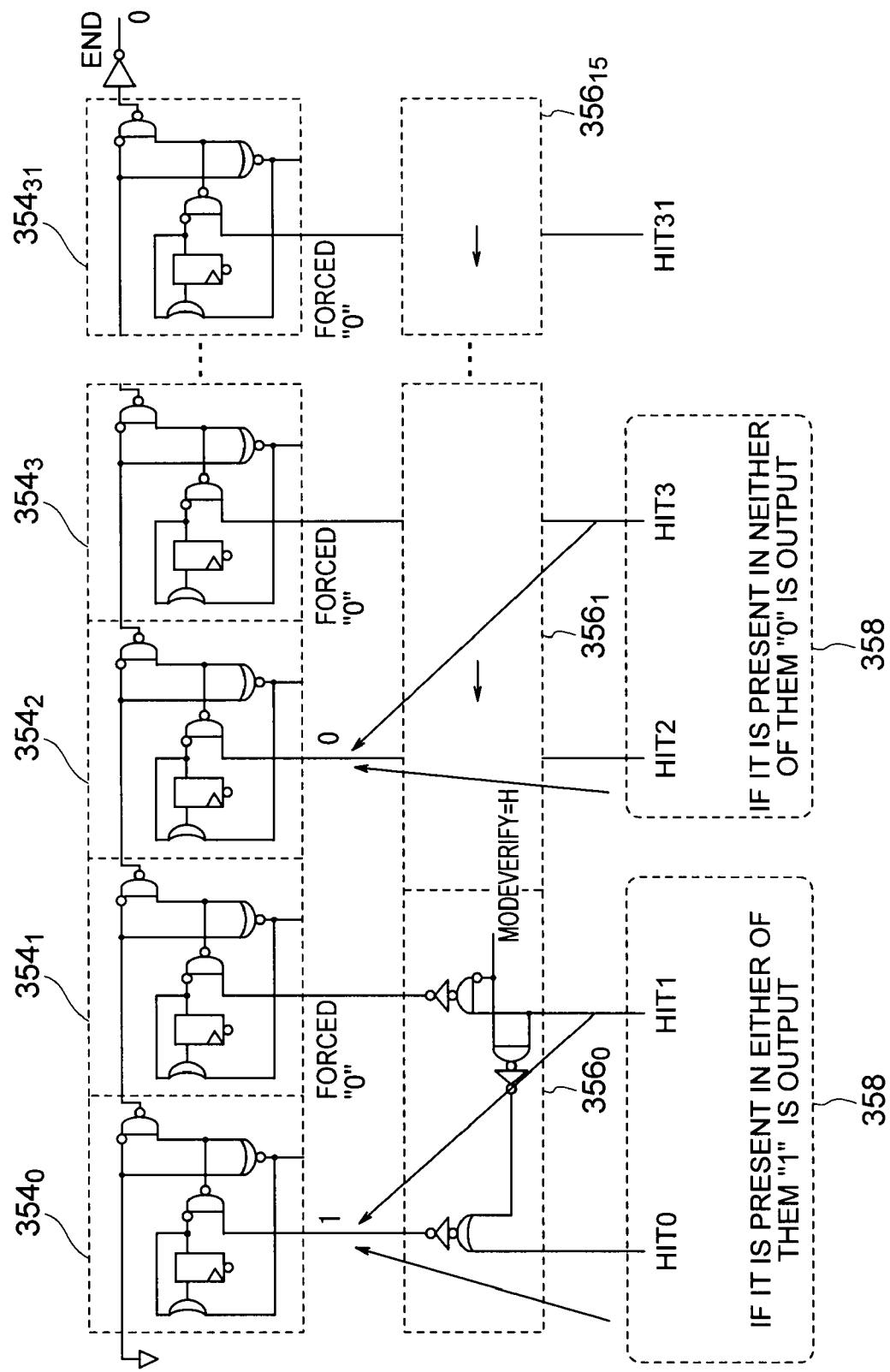
FIG. 16 is a diagram showing a state of the AAS main circuit at the time of verify operation.

The second data buffer 34 which latches data to be subjected to the verify decision is also controlled with the AAS address [4:1]. In other words, skipping of the AAS address at the time of the verify decision is performed by taking AAS address [4:1] as the unit. For example, an address search subsequent to the first decision signal HIT0 or the second decision signal HIT1 is performed for an AAS address corresponding to the first decision signal HIT2 or the second decision signal HIT3. This is implemented with the control signal MODEVERIFY signal="1" in the AAS main circuit 351 shown in FIG. 10. States of the AAS main circuit 351 at this time are shown in FIG. 16.

In this way, the present embodiment has a feature that the address generation in the AAS circuit 35 is variable for each of the write mode and verify mode.

As shown in FIG. 15, the verify data control circuit 38 passes only object bits of the verify decision (write object bits) by inverting the verify data A (at the time of write verify), and forcibly sets bits which are not write objects to 1. The reason is that the automatic operation sense amplifier circuit 14 outputs 0 when the write object bit has passed the write verify decision, outputs 1 when the write object bit has failed the write verify decision, and outputs 1 for a bit which is not the write object. A measure is taken to prevent a bit which is not a write object from becoming a write object bit. Furthermore, a measure is taken to prevent a bit which has passed the verify decision once from becoming a write object bit.

In the verify operation, the value of the END signal becomes "1" when the final AAS address is executed in the same way as the write mode.

After verifying the bit at the final AAS address, the automatic operation control circuit 26 generates the control signal AASRST. If the value of the END signal is "1" at this time, it is meant that all data (10) writes have passed (since the decision signal HIT is not present, the value of the END signal remains "1"). If a fail bit is present, then the value of the END signal becomes "0", the value of the control signal MODE-VERIFY is set to "0" and writing of data (10) is executed again.

Figure 17:
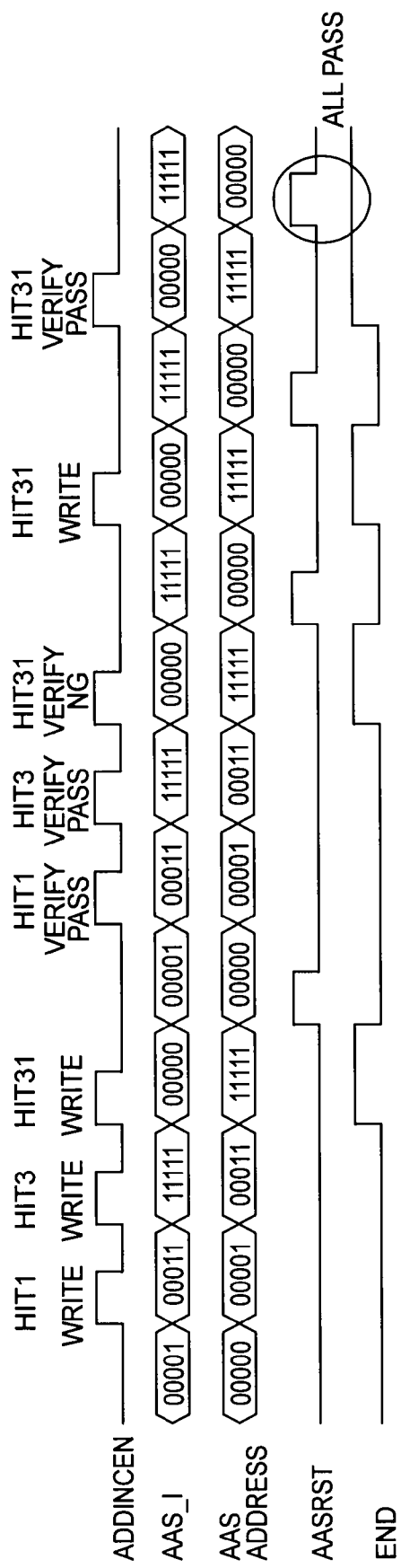
FIG. 17 is a timing diagram in the case where write operation and verify operation are repeated.

FIG. 17 is a timing diagram in the case where the write operation and the verify operation are repeated. In the case shown in FIG. 17, write operation (only AAS addresses corresponding to the decision signals HIT1, HIT3 and HIT31) is executed, only the AAS address corresponding to the decision signal HIT31 has failed in the verify operation (only AAS addresses corresponding to the decision signals HIT1, HIT3 and HIT31). If the control signal AASRST is generated, then it follows that END="0" and AAS_I assumes "11111" because only the decision signal HIT31 is 1. When executing the write again, therefore, the write operation is executed from the AAS address "11111" (see FIG. 17). In this way, the write operation and the verify operation of the data (10) are performed.

Write Operation and Verify Decision of Data (00)

The write operation and verify decision of data (00) will now be described.

After the write operation and verify decision of data (10) have been completed, a shift to the write operation of data (00) is made. Since write object bits of the data (00) are stored on the upper bit side (UB side) of the second data buffer 34, however, the data pattern selection signal [1:0] is set equal to "00". And the write operation and the verify operation are performed by using the AAS circuit 35 in the same way as described with reference to the data (10).

Write Operation and Verify Decision of Data (01)

The write operation and verify decision of data (01) will now be described.

Since write data of the data (01) is not present in the second data buffer 34, the data pattern selection signal [1:0] is set equal to "01" and data is transferred from the first data buffer 31 to the second data buffer 34. Thereafter, the write operation and the verify operation are performed by using the AAS circuit 35 in the same way as described with reference to the data (10).

Figure 18:
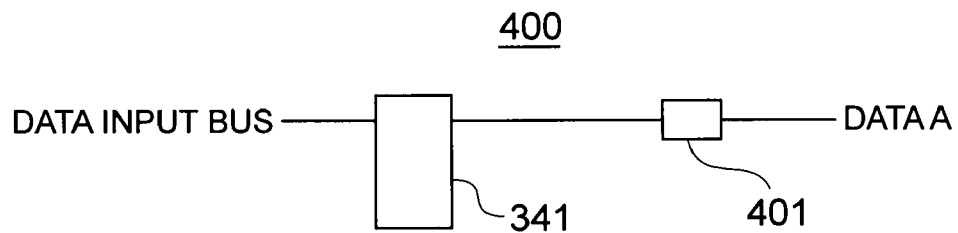
FIG. 18 is a circuit diagram showing an output stage of the second data buffer in the first embodiment.

In the present embodiment, the second data buffer 34 includes an analog switch (transfer gate) 401 formed of a P-channel transistor and an N-channel transistor in an output stage of the data retention circuit 341 as shown in FIG. 18.

Figure 19:
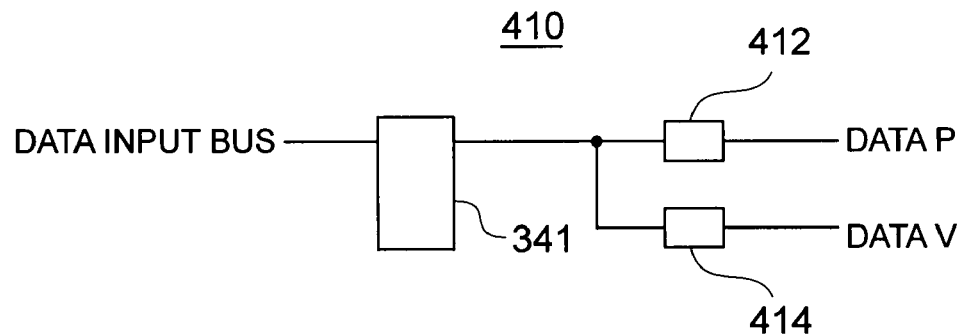
FIG. 19 is a circuit diagram showing an output stage of the second data buffer in a modification of the first embodiment.

In order to output different data onto the same output bus in different operation modes such as the write operation and the verify operation as in a modification of the present embodiment, the second data buffer 34 may include two analog switches (transfer gates) 412 and 414 each formed of a P-channel transistor and an N-channel transistor on the output stage of the data retention circuit 341 as shown in FIG. 19. In other words, the second data buffer 34 may be configured so as to conduct two-port output control.

When the control signal MODEVERIFY="0" (at the time of write mode), the switch 412 outputs data corresponding to eight pages indicated by a column address B [4:0]. When the control signal MODEVERIFY="1" (at the time of verify mode), the switch 414 outputs the column address B [4:1] and data corresponding to eight pages on the upper bit side (UB side) indicated by the control signal UBEN1="1", or the column address B [4:1] and data corresponding to eight pages on the lower bit side (LB side) indicated by the control signal LBEN1="1".

Figure 20:
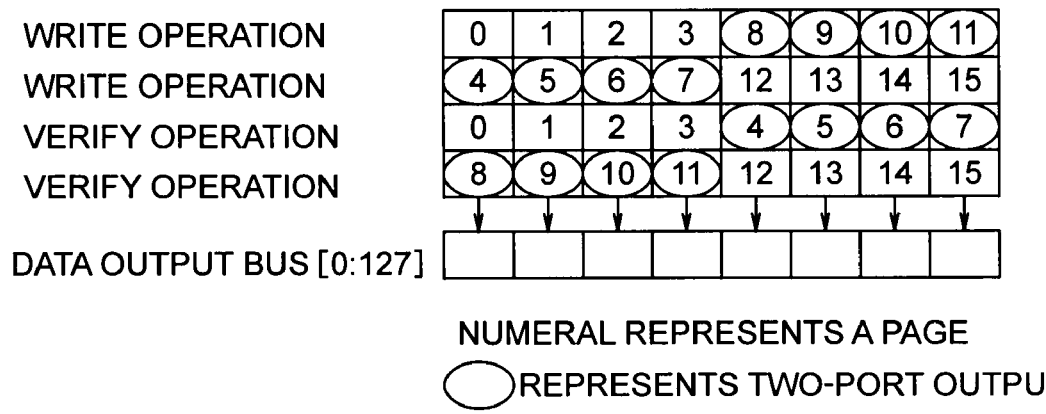
FIG. 20 is a diagram showing relations between each page and a data output bus to which an output of the second data buffer is sent, in the write operation and the verify operation obtained when two-port output control is exercised.

Relations between pages in the write operation and the verify operation at the time when the two-port output control is exercised and data output buses to which the output of the second data buffer is sent are shown in FIG. 20.

For example, as shown in FIG. 20, data on Page 4 is output onto a data bus [0:15] at the time of the write operation and output onto a data bus [64:79] at the time of the verify operation.

If a write object bit is not present, the address is skipped to an address where a write object bit is present, as heretofore described. According to the present embodiment, therefore, the automatic write operation time can be made as short as possible.

SECOND EMBODIMENT

A non-volatile semiconductor storage device according to a second embodiment of the present invention will now be described.

The non-volatile semiconductor storage device according to the present embodiment conducts state multi write and a verify operation in the non-volatile semiconductor storage device according to the first embodiment. The state multi write is a mode in which the (10) level and the (00) level in the multi-value storage level are written simultaneously. If the data pattern selection signal [1:0] is set equal to "10" and data is transferred from the first data buffer 31 to the second data buffer 34 as described in the first embodiment, then write object data at the (00) level is stored in the upper bit side (UB side) and write object data at the (10) level is stored in the lower bit side (LB side).

Before entering the write operation, the data pattern selection signal [1:0] is set equal to "11" (state multi write mode) (see FIG. 2). In FIG. 5, values of both control signals UBEN2 and LBEN2 become "1" and the logic for generating the decision signal HIT searches for write object bits at both the (10) level and the (00) level. It becomes possible to write the (10) level and the (00) level simultaneously with an address skip in the AAS circuit 35 by setting the control signal AASEN="1" and exercising control similar to that of the data (10) write in the AAS circuit 35 in the first embodiment.

As for write data of the state multi, output data of the second data buffer 34 is compressed by the write data multi-value compression circuit 37, and sent to the memory blocks 2 via the PRG data bus. At the time of state multi write, a bit which is 0 in lower bit LB in the multi-value compressed bit pair is output to the PRG data bus for the data (10) write or a bit which is 0 in upper bit UB in the multi-value compressed bit pair is output to the PRG data bus as 1 (write object bit) for the data (00) write. It thus becomes possible to write the (10) level and the (00) level simultaneously in the multi-value storage level.

After the write operation is finished, verify operation is performed. Since the (10) level is different from the (00) level in threshold level, however, verify of the (10) level and verify of the (00) level are performed separately. When performing the verification of the (10) level, the data pattern selection signal [1:0] is set equal to "10" and verification is performed using the AAS circuit 35. The data pattern selection signal [1:0] is set equal to "10". As for generation of the decision signal HIT in FIG. 5, it follows that UBEN2="0" and LBEN2="1" and verify of an address where a write object bit on the LB side (data (10) side) is present is performed. In the same way, as for verify of the data (00) as well, it is possible to conduct only an address where a write object bit on the UB side (data (00) side) is present by setting the verify data pattern selection signal [1:0] equal to "00".

As for the decision of the operation end, verify of the data (10) and verify of the data (00) are executed and then the data pattern selection signal [1:0] is set equal to "00" (state multi write). If the value of the END signal is "1", the decision of the operation end is finished. If a fail bit remains, then the AAS circuit 35 conducts simultaneous write of the data (10) and the data (00) on the basis of the decision signal HIT after the verify update again.

If a write object bit is not present in the state multi write operation, the address is skipped to an address where a write object bit is present in the same way as the first embodiment, as heretofore described. According to the present embodiment, therefore, the automatic write operation time can be made as short as possible.

THIRD EMBODIMENT

A non-volatile semiconductor storage device according to a third embodiment of the present invention will now be described.

The non-volatile semiconductor storage device according to the present embodiment uses the AAS circuit 35 at the time of erase verify, excessive erase verify and excessive erase cell rewrite in automatic erase operation, and at the time of erase and write operation in product tests in the non-volatile semiconductor storage device according to the first embodiment.

In the NOR-type flash memory, threshold control in the erase state is important. It is necessary that the threshold of a memory cell after erase is controlled to become at least 0 V. Hereafter, a method for exercising such threshold control in the above-described configuration will be described.

In the non-volatile semiconductor storage device according to the first embodiment, the control signal APRG[1:0] is input to the input side of the second data buffer 34. A control signal APRG[1] is input to the upper bit side (UB side (128 bits)) of the input data bus of the second data buffer 34. Data and a control signal APRG[0] are input to the lower bit side (LB side (128 bits)) of the input data bus of the second data buffer 34.

Initialization

Initialization is performed as described below. First, setting is performed as follows: control signal AASEN="0", control signal MODEVERIFY="0", data pattern selection signal [1:0]="01". Latch is performed in the second data buffer 34. As for the address at this time, all upper bits (UB) side of the second data buffer 34 are latched to "0" by using the column address A generated by the address generation circuit 24 in the automatic operation control system 20. At this time, all lower bits (LB) side are latched to "1". As a result, all decision signals HIT0 to HIT31 become a decision that there is data after completion of the latch.

The setting of the data pattern selection signal [1:0]="01", does not mean that the object of the level of the memory cell is (01), but means that the UB side region of the second data buffer 34 is used to determine whether there is a verify object bit.

Erase Verify

Erase verification is performed as described below. First, setting is performed as follows: control signal MODEEV="1", control signal MODEVERIFY="1", and control signal AASEN="1". Verify is performed by using the AAS address from the AAS circuit 35. As for the decision result in the automatic operation sense amplifier circuit 14 in the erase mode, "1" is output for erase verify pass whereas "0" is output for erase verify fail. Therefore, the verify data control circuit 38 shown in FIG. 15 latches the output of the automatic operation sense amplifier circuit 14 in the second data buffer 34 without inverting the output. As described with reference to the verify decision of the data (10) and latch in the second data buffer in the first embodiment, the decision result is passed through for only verify object bits and "1" is output for non-object bits.

As for the first erase verify, all of the decision signals HIT0 to HIT31 are in the state that data is present. Therefore, the AAS circuit 35 outputs an AAS address without a skip and verification is performed. If an erase verify fail bit is present (as for the decision method, AASRST is inserted after the verification and termination is performed if the END signal is 0), then erase operation execution→erase verify is repeated. In the ensuing verify, only addresses where verify object bits are present are verified. If an erase verify fail bit is not present, then the control signal AASRST is generated after verify and the processing is finished if the END signal is 0.

Excessive Erase Verify and Excessive Erase Cell Rewrite

Excessive erase verify and excessive erase cell rewrite will now be described. First, from the initialization state, the control signal MODEEV="0", control signal MODEVERIFY="1" and the control signal AASEN="1" are set. Excessive erase verification is performed by using the AAS address from the AAS circuit 35. If a fail bit is present in the excessive verify, then writing is performed by using the AAS address supplied from the AAS circuit 35 with the control signal MODEEV="0", control signal MODEVERIFY="0" and the control signal AASEN="1".

Erase and Write in Product Test

In the erase and write operation in the product test as well, address skip becomes possible by using the AAS circuit 35 in the same way as the foregoing description. In this case, the test time can be shortened.

If a verify object bit is not present, the address is skipped to an address where a verify object bit is present in the same way as the first embodiment, as heretofore described. According to the present embodiment as well, therefore, the erase and write operation time in the product test can be made as short as possible.

FOURTH EMBODIMENT

A non-volatile semiconductor storage device according to a fourth embodiment of the present invention will now be described.

The non-volatile semiconductor storage device according to the present embodiment conducts a memory cell read test to confirm the cell threshold level after the write and erase at the time of the product test in the non-volatile semiconductor storage device according to the first embodiment.

The verify data output decode circuit 39 shown in FIG. 1 is used in the non-volatile semiconductor storage device according to the first embodiment.

First, the control signal MODEVERIFY="1", the control signal AASEN="0", and the data pattern selection signal [1:0]="01" are set. Cell read of a memory cell (readout performed by the automatic operation sense amplifier circuit 14) is performed with an address generated by the address generation circuit 24 in the automatic operation control system 20 without using the AAS address. A result of the read is stored in the second data buffer 34.

Since the control signal AASEN="0", the verify data control circuit 38 shown in FIG. 15 passes all bits sent from the sense amplifier 14 through it and stores them in the second data buffer 34. In the present embodiment, verify read data for one time is 128 bits. Therefore, page readout of eight pages becomes possible by using the page address shown in FIG. 1 after the verify read.

The page address is coupled directly to the address terminal. In other words, a page to be output can be selected at the external address terminal 103. In the same way, as for the address of a memory cell array at the time of verify read as well, data at an address indicated by the block address, the row address and the column address B is read.

An output of the verify data output decode circuit 39 sent onto a verify page output bus can be output from the data input-output terminal 104 to the external. If the output of the verify data output decode circuit 39 is sent to the automatic operation control circuit 26, page readout becomes possible even in an automatic operation test which contains a BIST (Built In Self Test) and which is closed within a chip, Therefore, the test time can be improved. The block address, the row address, the column address B and the page address at the time of BIST are generated by the automatic operation control circuit 26.

FIFTH EMBODIMENT

A non-volatile semiconductor storage device according to a fifth embodiment of the present invention will now be described.

In the non-volatile semiconductor storage device according to the first to fourth embodiment, the second data buffer 34 includes sixty-four data decision circuits $343_1$ to $343_4$, and data retention circuits $341_0$ to $341_{15}$ which retain data corresponding to 4,096 bits in total. The area occupied by the second data buffer 34 in the chip is considerably large. The non-volatile semiconductor storage device according to the present embodiment is nearly the same in basic circuit structure as the non-volatile semiconductor storage device according to the first embodiment shown in FIG. 1. However, the non-volatile semiconductor storage device according to the present embodiment is different from the non-volatile semiconductor storage device according to the first embodiment shown in FIG. 1 in the following points.

The first data buffer 31, the data conversion circuit 32, the data input selection circuit 33 and the second data buffer 34 are replaced by a first data buffer 31A, a data conversion circuit 32A, a data input selection circuit 33A and a second data buffer 34A, respectively. In addition, the write data multi-value compression circuit 37 is replaced by a write data mask circuit 40 and a write data changeover circuit 42. In addition, a sense amplifier data mask circuit 44 is newly provided. The write data mask circuit 40 and the write data changeover circuit 42 are provided between the second data buffer 34A and the memory blocks 2. The sense amplifier data mask circuit 44 is provided between the automatic operation sense amplifier circuit 14 and the verify data control circuit 38.

The first data buffer 31A can retain data of 256 pages in the same way as the first data buffer 31 according to the first embodiment. Unlike the first data buffer 31, however, the first data buffer 31A receives the column address signal B. The data conversion circuit 32A converts 256-bit data sent from the first data buffer 31A via a first output data bus, sends 128-bit data DATA obtained by the conversion to the data input selection circuit 33A, and transmits 128-bit UBB data to the second data buffer 34A, the write data mask circuit 40 and the sense amplifier data mask circuit 44 via a UBB data bus.

The configuration and operation of the non-volatile semiconductor storage device according to the present embodiment will now be described by taking automatic page write operation as an example. In the ensuing description, it is supposed that the number of pages for automatic page write is 256, the number of bits which can be written into the memory blocks 2 at a time is 64, and the number of bits which can be read out by the automatic operation sense amplifier circuit 14 at a time write is 128.

Operation is performed in the same way as the description of the first embodiment until the automatic page write command is input and write data is stored in the first data buffer 31A. If transfer of write data to the first data buffer 31A is finished, therefore, 256-page data Page 0 to Page 255 where each page is formed of 16 bits is stored in the first data buffer 31A.

After the transfer of write data to the first data buffer 31A is finished, the stored write data is converted by the data conversion circuit 32A to search for data to be written (for example, data (01)) from among write data stored in the first data buffer 31A. This data conversion is performed as hereafter described.

First, if the data to be written is data (01), then a data pattern selection signal [1:0] sent from the automatic operation control circuit 26 to the data conversion circuit 32A becomes "01".

Figure 24:
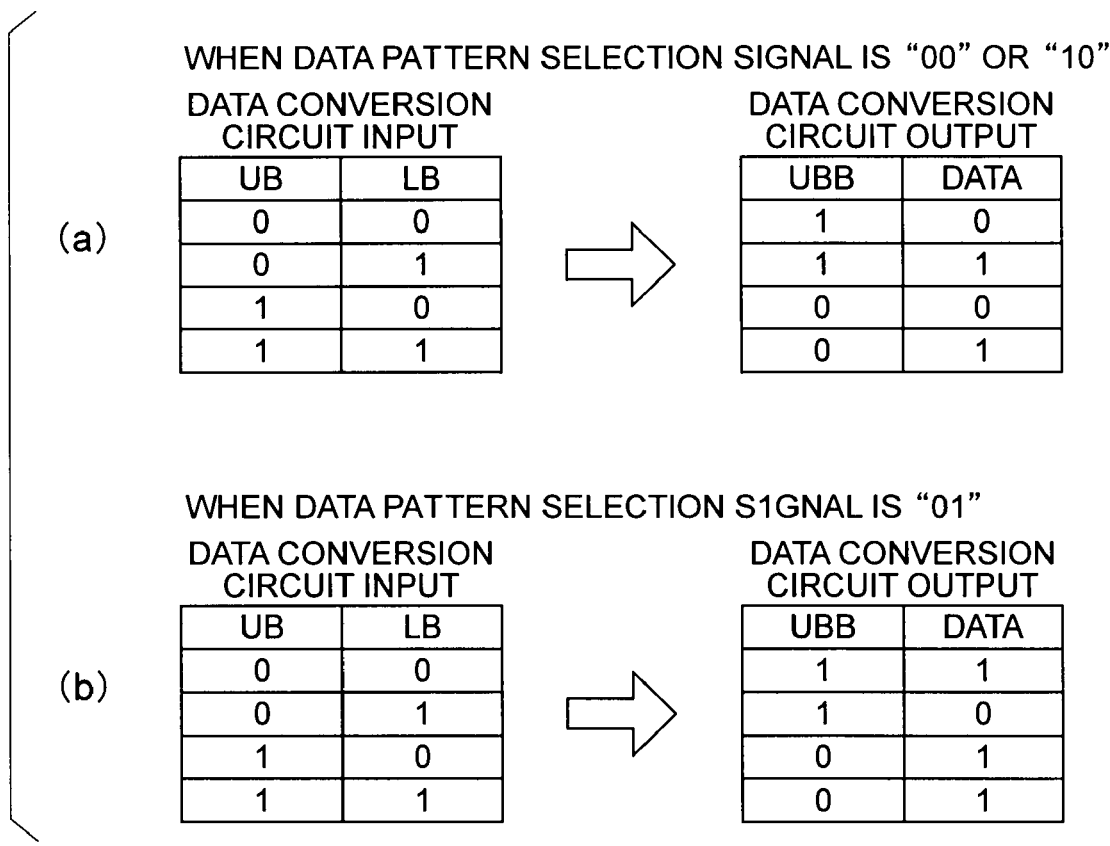
FIGS. 24(a) and 24(b) are diagrams for explaining data conversion in a data conversion circuit according to the fifth embodiment.

In this case, the multi-value compressed bit pair (01) is converted to "0" in the value of the DATA signal by the data conversion circuit 32A as shown in FIG. 24(b), and transmitted to the data input selection circuit 33A. Since the upper bit UB of the multi-value compressed bit pair (01) is "0", data UBB which is inverted data of UB becomes "1" as shown in FIG. 24(b) and resultant data is transmitted from the data conversion circuit 32A to the second data buffer 34A, the write data mask circuit 40 and the sense amplifier data mask circuit 44. In this case, other multi-value compressed bit pairs (00), (10) and (11) are converted to "1" in value of the DATA signal and transmitted to the data input selection circuit 33A.

If data to be written is data (00) or data (10), the data pattern selection signal [1:0] sent from the automatic operation control circuit 26 to the data conversion circuit 32A becomes "00" or "10". In this case, the multi-value compressed bit pair (00) or (10) is converted to "0" in the value of the DATA signal by the data conversion circuit 32A as shown in FIG. 24(a), and output. Since the upper bit UB of the multi-value compressed bit pair (00) or (10) is "0" or "0", respectively, data UBB which is inverted data of UB becomes "1" or "0", respectively, as shown in FIG. 24(a) and resultant data is transmitted from the data conversion circuit 32A to the second data buffer 34A, the write data mask circuit 40 and the sense amplifier data mask circuit 44. In this case, other multi-value compressed bit pairs (01) and (11) are converted to "1" in value of the DATA signal and transmitted to the data input selection circuit 33A.

Two bits in the multi-value compressed bit pair are compressed to one bit by thus converting data conversion in the data conversion circuit 32, and the bit data DATA obtained by the compression is transmitted to the second data buffer. Therefore, 32-bit multi-value compressed pair is compressed by the data conversion circuit 32A to become 16-bit data. For example, 32-bit multi-value compressed pair formed of 16-bit data Page 0 and 16-bit data Page 8 is compressed by the data conversion circuit 32A to become 16-bit compressed data Page 0_8. 32-bit multi-value compressed pair formed of 16-bit data Page 1 and 16-bit data Page 9 is compressed by the data conversion circuit 32A to become 16-bit compressed data Page 1_9. In the same way, supposing i to be an integer in the range of 0 to 7, 32-bit multi-value compressed pair formed of 16-bit data Page (i) and 16-bit data Page (i+8) is compressed by the data conversion circuit 32A to become 16-bit compressed data Page (i)_(i+8). The data conversion circuit 32A also outputs UBB data which is an inverted signal of the upper bit UB, and transmits the UBB data to the second data buffer 34A, the write data mask circuit 40 and the sense amplifier data mask circuit 44.

The data input selection circuit 33A selects either the 128-bit data group DATA obtained by the conversion in the data conversion circuit 32A or the data group transferred from the verify data control circuit 38 on the basis of the path selection signal [1:0] or the signal APRG [1:0] sent from the automatic operation control circuit 26, and transfers the selected data group to the second data buffer 34A.

Figure 25:
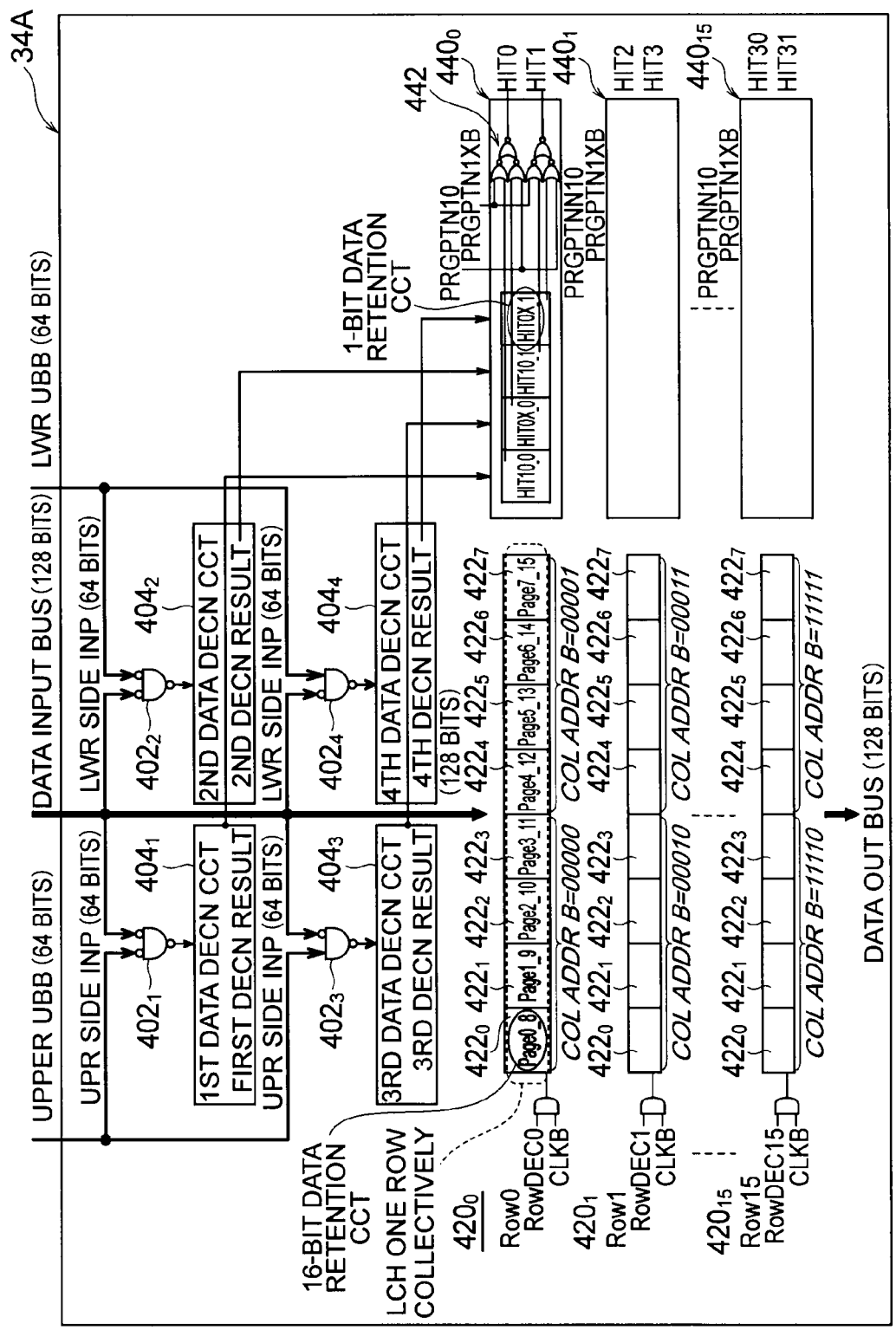
FIG. 25 is a block diagram showing a configuration of a concrete example of the second data buffer.

The second data buffer 34A according to the present embodiment will now be described. A concrete example of a circuit of the second data buffer 34A is shown in FIG. 25. The second data buffer 34A in this concrete example includes first to fourth data mask circuits $402_1$ to $402_4$, first to fourth data decision circuits $404_1$ to $404_4$, sixteen data buffer circuits $420_0$ to $420_{15}$, and sixteen decision result output circuits $440_0$ to $440_{15}$. Each data buffer circuit $420_i$ (i=0, 1, ..., 15) includes eight data retention circuits $422_0$ to $422_7$. The data retention circuit $422_i$ (i=0, 1, ..., 7) retains 16-bit compressed data Page (i)_(i+8) obtained by compression in the data conversion circuit 32A. Each decision result output circuit $440_i$ (i=0, 1, ..., 15) includes four data retention circuits HIT10_0, HIT0X_0, HIT10_1 and HIT0X_1 each of which retains one-bit data and a logic circuit 442.

A configuration and operation of the second data buffer 34A will now be described.

A compressed data group formed of eight 16-bit compressed data Page 0_8, Page 1_9, Page 2_10, Page 3_11, Page 4_12, Page 5_13, Page 6_14 and Page 7_15 is transferred by performing transfer from the data conversion circuit 32A to the second data buffer 34A via the data input selection circuit 33A once. They are retained in the data retention circuits $422_0$, $422_1$, $422_2$, $422_3$, $422_4$, $422_5$, $422_6$ and $422_7$, respectively. The compressed data group Page 0_8, Page 1_9, Page 2_10, Page 3_11, Page 4_12, Page 5_13, Page 6_14 and Page 7_15 obtained by the ith (i=1, ..., 16) transfer is retained by the data retention circuits $422_0$, $422_1$, $422_2$, $422_3$, $422_4$, $422_5$, $422_6$ and $422_7$ in the data buffer circuit $420_i$. In the present embodiment, four compressed data groups Page 0_8, Page 1_9, Page 2_10, Page 3_11 among eight compressed data groups Page 0_8, Page 1_9, Page 2_10, Page 3_11, Page 4_12, Page 5_13, Page 6_14 and Page 7_15 are referred to as upper compressed data group, and four remaining compressed data groups Page 4_12, Page 5_13, Page 6_14 and Page 7_15 are referred to as lower compressed data group.

Each time data is transferred, it is determined in the first to fourth data mask circuits $402_1$ to $402_4$ and the first to fourth data decision circuits $404_1$ to $404_4$ whether write data is present.

The first data mask circuit $402_1$ determines whether data (10) to be written is present in the upper compressed data group, i.e., whether data which becomes (10) in multi-value compressed bit pair is present in the original multi-value compressed pairs in the upper compressed data group on the basis of each 64-bit data DATA in the upper compressed data group and data UBB corresponding to the data DATA. 64-bit pairs including a pair of data DATA and data UBB are input to the first data mask circuit $402_1$. Only for a bit pair of DATA=0 and UBB=0 in the input 64-bit pairs, the corresponding output bit is output as "0". For other bit pairs, the corresponding output bit is output as "1". If data to be written is (10), therefore, the first data mask circuit $402_1$ outputs "0". If data to be written is other than (10), the first data mask circuit $402_1$ masks and outputs "1".

In the same way, the second data mask circuit $402_2$ determines whether data (10) to be written is present in the lower compressed data group on the basis of each 64-bit data DATA in the lower compressed data group and data UBB corresponding to the data DATA. In the same way as the first data mask circuit $402_1$, 64-bit pairs including a pair of data DATA and data UBB are input to the first data mask circuit $402_1$. Only for a bit pair of DATA=0 and UBB=0 in the input 64-bit pairs, the corresponding output bit is output as "0". For other bit pairs, the corresponding output bit is output as "1". If data to be written is (10), therefore, the second data mask circuit $402_2$ outputs "0". If data to be written is other than (10), the second data mask circuit $402_2$ masks and outputs "1".

The third data mask circuit $402_3$ determines whether data (00) or (01) to be written is present in the upper compressed data group on the basis of each 64-bit data DATA in the upper compressed data group and data UBB corresponding to the data DATA. 64-bit pairs including a pair of data DATA and data UBB are input to the third data mask circuit $402_3$. Only for a bit pair of DATA=0 and UBB=0 in the input 64-bit pairs, the corresponding output bit is output as "0". For other bit pairs, the corresponding output bit is output as "1". If data to be written is (00) or (01), therefore, the third data mask circuit $402_3$ outputs "0". If data to be written is other than (00) or (01), the third data mask circuit $402_3$ masks and outputs "1".

The fourth data mask circuit $402_4$ determines whether data (00) or (01) to be written is present in the lower compressed data group on the basis of each 64-bit data DATA in the lower compressed data group and data UBB corresponding to the data DATA. In the same way as the third data mask circuit $402_3$, 64-bit pairs including a pair of data DATA and data UBB are input to the fourth data mask circuit $402_4$. Only for a bit pair of DATA=0 and UBB=0 in the input 64-bit pairs, the corresponding output bit is output as "0". For other bit pairs, the corresponding output bit is output as "1". If data to be written is (00) or (01), therefore, the fourth data mask circuit $402_4$ outputs "0". If data to be written is other than (00) or (01), the fourth data mask circuit $402_4$ masks and outputs "1".

The first data decision circuit $404_1$ makes a decision whether write data is present on the basis of the 64-bit output of the first data mask circuit $402_1$. If write data is present, i.e., at least one bit which becomes "0" is present in 64 bits output from the first data mask circuit $402_1$, then the first data decision circuit $404_1$ outputs "1" as a first decision result. If write data is not present, i.e., all of 64 bits output from the first data decision circuit $402_1$ are "1", then the first data decision circuit $404_1$ outputs "0" as the first decision result, sends the first decision result to the data retention circuit HIT10_0, and causes the data retention circuit HIT10_0 to retain the first decision result.

The second data decision circuit $404_2$ makes a decision whether write data is present on the basis of the 64-bit output of the second data mask circuit $402_2$. If write data is present, i.e., at least one bit which becomes "0" is present in 64 bits output from the second data decision circuit $402_2$, then the second data decision circuit $404_2$ outputs "1" as a second decision result. If write data is not present, i.e., all of 64 bits output from the second data decision circuit $402_2$ are "1", then the second data decision circuit $404_2$ outputs "0" as the second decision result, sends the second decision result to the data retention circuit HIT10_1, and causes the data retention circuit HIT10_1 to retain the second decision result.

The third data decision circuit $404_3$ makes a decision whether write data is present on the basis of the 64-bit output of the third data mask circuit $402_3$. If write data is present, i.e., at least one bit which becomes "0" is present in 64 bits output from the third data decision circuit $402_3$, then the third data decision circuit $404_3$ outputs "1" as a third decision result. If write data is not present, i.e., all of 64 bits output from the third data decision circuit $402_3$ are "1", then the third data decision circuit $404_3$ outputs "0" as the third decision result, sends the third decision result to the data retention circuit HIT0X_0, and causes the data retention circuit HIT0X_0 to retain the third decision result.

The fourth data decision circuit $404_4$ makes a decision whether write data is present on the basis of the 64-bit output of the fourth data mask circuit $402_4$. If write data is present, i.e., at least one bit which becomes "0" is present in 64 bits output from the fourth data decision circuit $402_4$, then the fourth data decision circuit $404_4$ outputs "1" as a fourth decision result. If write data is not present, i.e., all of 64 bits output from the fourth data decision circuit $402_4$ are "1", then the fourth data decision circuit $404_4$ outputs "0" as the fourth decision result, sends the fourth decision result to the data retention circuit HIT0X_1, and causes the data retention circuit HIT0X_1 to retain the fourth decision result.

Timing of retaining the decision results in the data retention circuits HIT10_0, HIT10_1, HIT0X_0 and HITX0_1 is the same as timing of retaining the data in the data retention circuits $422_i$ (i=0, 1, ..., 7).

The logic circuit 442 in each decision result output circuit $440_i$ (i=0, 1, ..., 15) includes first to sixth NOR gates. The first NOR gate conducts NOR operation on the first decision result retained in the data retention circuit HIT10_0 and a signal PRGPTN1XB. The second NOR gate conducts NOR operation on the third decision result retained in the data retention circuit HIT0X_0 and a signal PRGPTNN10. The third NOR gate conducts NOR operation on the first and second NOR gates and outputs a decision signal HIT(2i). The fourth NOR gate conducts NOR operation on the second decision result retained in the data retention circuit HIT10_1 and the signal PRGPTN1XB. The fifth NOR gate conducts NOR operation on the fourth decision result retained in the data retention circuit HIT0X_1 and the signal PRGPTNN10. The sixth NOR gate conducts NOR operation on the fourth and fifth NOR gates and outputs a decision signal HIT(2i+1).

If all data are transferred from the first data buffer 31A to the second data buffer 34A and the data pattern selection signal [1:0] is "10", then the signal PRGPTN10 becomes "1" and the signal PRGPTN1XB becomes "0". Outputs of the data retention circuits HIT10_0 and HIT10_1, i.e., decision results in a place where the data becomes "10" appear in the decision signals HIT0 to HIT31. If the data pattern selection signal [1:0] is "00" or "01", then the signal PRGPTN10 becomes "0" and the signal PRGPTN1XB becomes "1". Outputs of the data retention circuits HIT0X_0 and HIT0X_1. i.e., decision results in a place where the data becomes "00" or "01" appear in the decision signals HIT0 to HIT31. The decision signals HIT0 to HIT31 become "1" if write data is present.

At the time of state multi write operation, the data pattern selection signal [1:0] is set equal to "11" (state multi write mode) before entering the write operation. In this case, the signal PRGPTN10 shown in FIG. 25 becomes "0" and the signal PRGPTN1XB shown becomes "0". The logic for generating the decision signals HIT0 to HIT31 is performed by searching for write object bits in the data retention circuits HIT10_0, HIT10_1, HIT0X_0 and HIT0X_1.

Figure 26:
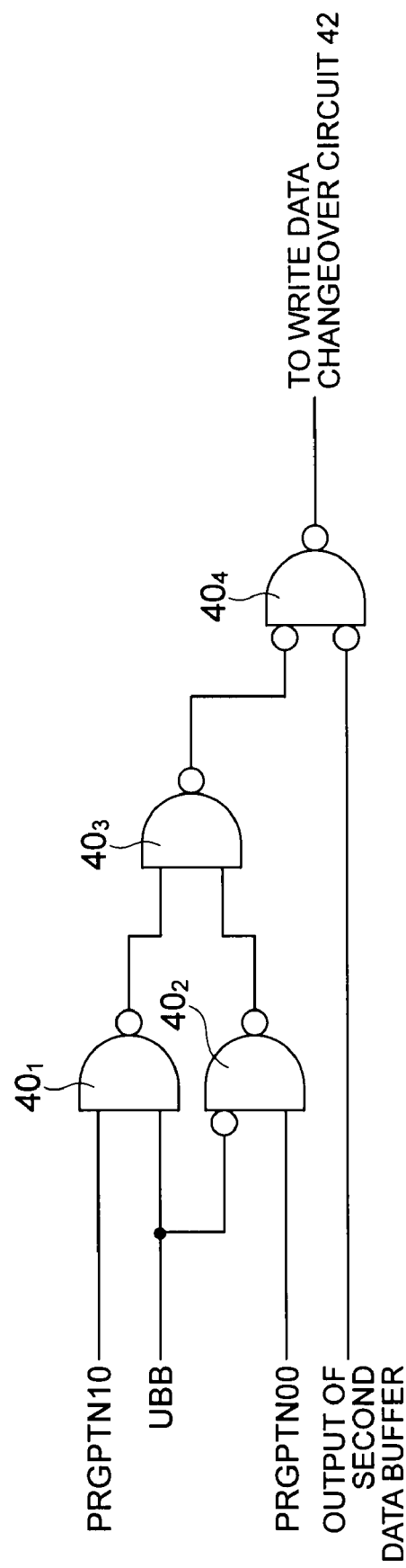
FIG. 26 is a circuit diagram showing a concrete example of a write data mask circuit.

Output data of the second data buffer are input to the write data mask circuit 40. A concrete example of the write data mask circuit 40 is shown in FIG. 26. The write data mask circuit 40 includes first to fourth NAND gates 40$_1$ to 40$_4$. The first NAND gate 40$_1$ conducts NAND operation on the signal PRGPTN10 and the inverted signal UBB of the upper bit UB. The second NAND gate 40$_2$ conducts NAND operation on the inverted value UB of the signal UBB and the signal PRGPTN00. The third NAND gate 40$_3$ conducts NAND operation on outputs of the first and second NAND gates. The fourth NAND gate 40$_4$ conducts NAND operation on an inverted value of an output of the third NAND gate and an output of the second data buffer 34A, and sends out a result of the operation to the write data changeover circuit 42.

Figures 27, 28:
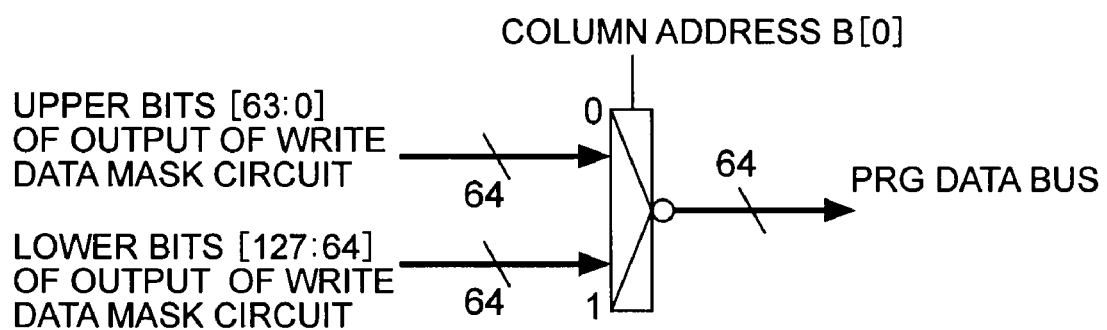
FIG. 27 is a diagram showing decode values of a signal PRGPTNN10B, a signal PRGPTN1XB, a signal PRGPTN10 and a signal PRGPTN00.
FIG. 28 is a circuit diagram showing a concrete example of a write data changeover circuit.

If the data pattern selection signal [1:0] is "10", then the signal PRGPTN10 becomes "1" and the signal PRGPTN00 becomes "0". If in this case the signal UBB is "1", then the write data mask circuit 40 masks an output to the write data changeover circuit 42 to "1". If the data pattern selection signal [1:0] is "00", then the signal PRGPTN10 becomes "0" and the signal PRGPTN00 becomes "1". If in this case the signal UBB is "0", then the write data mask circuit 40 masks the output to the write data changeover circuit 42 to "1". For example, if the data pattern selection signal [1:0] is "10", therefore, then the output of the second data buffer 34A becomes "0" in a place where the multi-value compressed pair is (00) as well. Since the signal UBB is "1", however, the output to the write data changeover circuit 42 is masked to "1". If the data pattern selection signal [1:0] is other than "10" and "00", then the output data of the second data buffer 34A is output intact to the write data changeover circuit 42 regardless of the value of the signal UBB. Only in the case where write object data of data (10), (00) or (01) is present in data retained by the second data buffer 34A, therefore, the write data mask circuit 40 outputs data "0". If the write object data of data (10), (00) or (01) is not present, then the write data mask circuit 40 outputs data "1". Decode values of the signal PRGPTN1XB, the signal PRGPTN10 and the signal PRGPTN00 are shown in FIG. 27. In other words, the write data mask circuit 40 outputs "0" in the case of a write object bit.

The write data changeover circuit 42 changes over upper bits (the 1st to the 64th bit) and lower bits (the 65th bit to the 127 bit) of output data (128 bits) of the write data mask circuit 40. If the column address B[0] is "0", then the write data changeover circuit 42 outputs "0" bits on the lower bit side to a PRG data bus as "1" (write object bits) and conducts writing. If the column address B[0] is "1", then the write data changeover circuit 42 outputs "0" bits on the upper bit side to the PRG data bus as "1" (write object bits) and conducts writing. In other words, only in the case where write object data is present, writing is performed. The write data changeover circuit 42 outputs "1" in the case of a write object bit.

Figure 29:
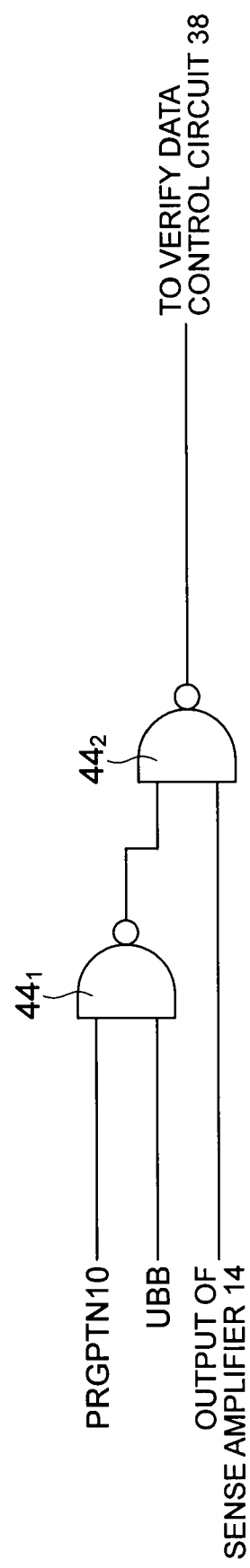
FIG. 29 is a circuit diagram showing a concrete example of a sense amplifier data mask circuit.

As for the verify operation after the writing is finished, verify operations at respective levels are performed separately in order to make a decision as to different threshold levels. A concrete example of the sense amplifier data mask circuit 44 is shown in FIG. 29.

The sense amplifier data mask circuit 44 includes a NAND gate 44$_1$ and an AND gate 44$_2$. The NAND gate 44$_1$ conducts NAND operation on the signal PRGPTN10 and the signal UBB, and sends a result of the operation to the AND gate 44$_2$. The AND gate 44$_2$ conducts AND operation on the output of the NAND gate 44$_1$ and the output of the sense amplifier 14, and sends a result of the operation to the verify data control circuit 38. If the data pattern selection signal [1:0] is "10", then the signal PRGPTN10 becomes "1". If in this case the signal UBB is "1" (multi-value compressed pair is "00" or "01"), then the sense amplifier data mask circuit 44 outputs "0" regardless of the output of the sense amplifier circuit 14. When verifying the "10" level, therefore, data in a place of the second data buffer 34A where the multi-value compressed pair becomes "00" is not destroyed.

Figure 23:
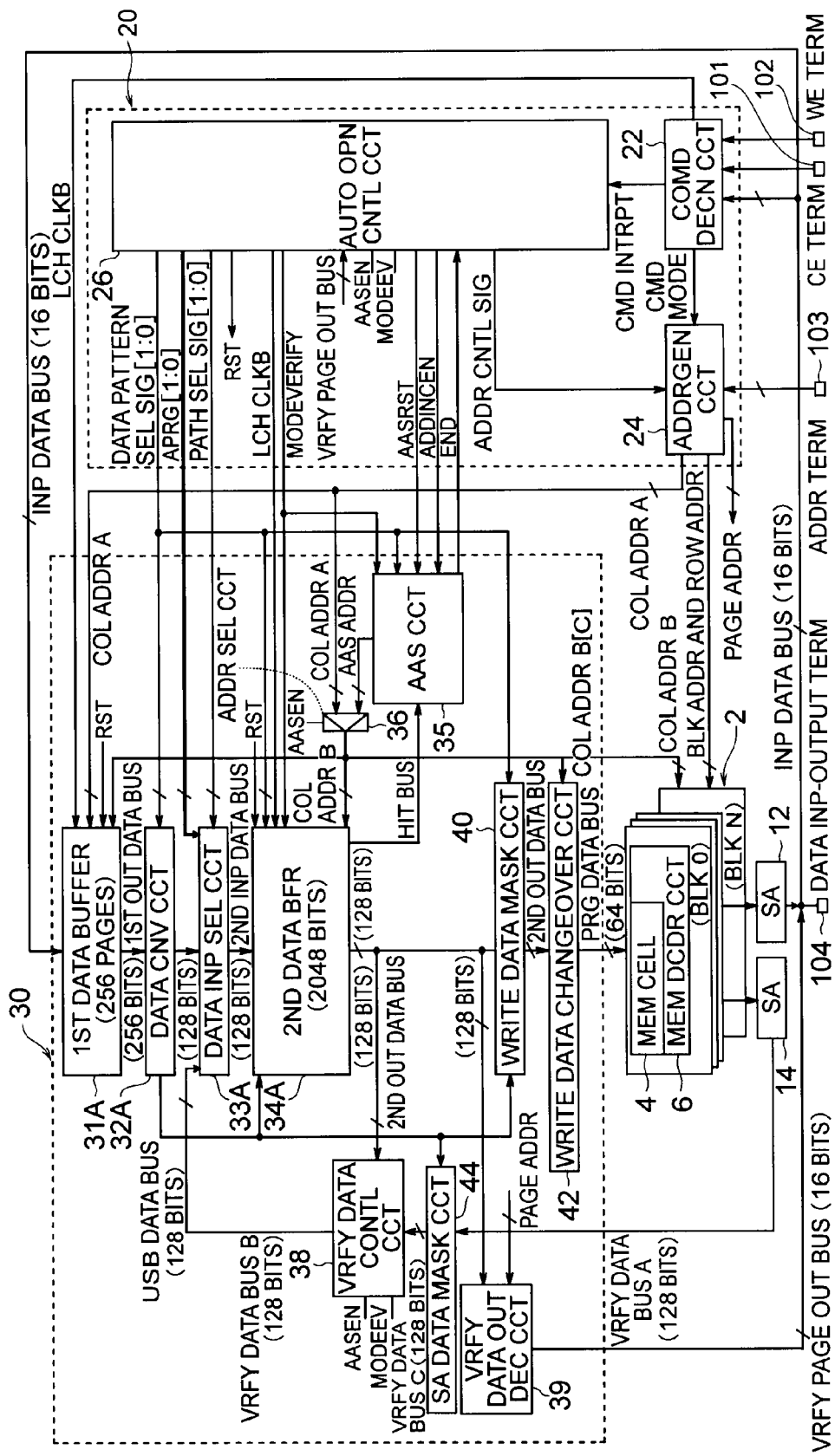
FIG. 23 is a block diagram showing a non-volatile semiconductor storage device according to a fifth embodiment.
Figure 30:
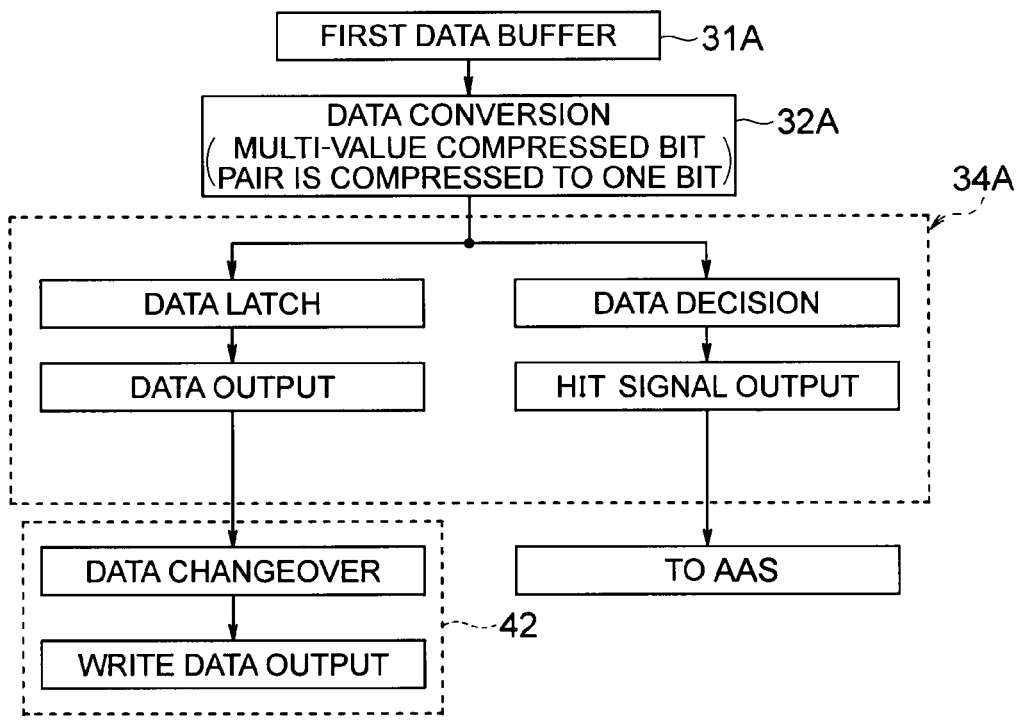
FIG. 30 is a diagram for explaining processing operation of the second data buffer according to the fifth embodiment.
Figure 31:
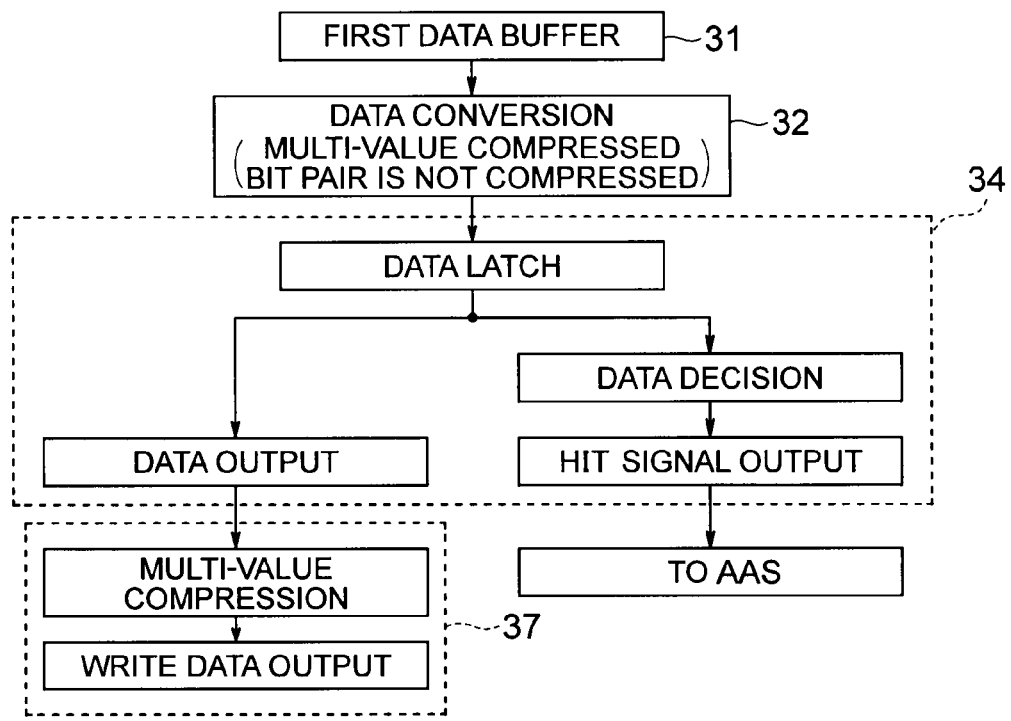
FIG. 31 is a diagram for explaining processing operation of the second data buffer according to first to fourth embodiments.

The processing operation in the second data buffer 34A according to the present embodiment heretofore described is shown in FIG. 30. The processing operation in the second data buffer 34 according to the first to fourth embodiments is shown in FIG. 31. As appreciated from FIG. 30, in the present embodiment, data sent from the first data buffer 31A is subjected to multi-value compression in the data conversion circuit 32A. Two bits in the multi-value compressed bit pair are compressed to one bit, and resultant data is sent to the second data buffer 34A. The data obtained by the conversion is latched and subjected to data decision simultaneously in the second data buffer 34A. The latched data is sent out to the write data changeover circuit 42 via the write data mask circuit 40 which is not illustrated (see FIG. 23). On the other hand, after the data decision is made in the second data buffer 34A, the decision signal HIT is output on the basis of a result of the decision and sent out to the AAS circuit 35.

On the other hand, as appreciated from FIG. 31, in the first to fourth embodiments, data sent out from the first data buffer 31 is subject to multi-value compression in the data conversion circuit 32. Multi-value compressed bit pair is sent to the second data buffer 34 while remaining two bits without being compressed. The data obtained by the conversion is first latched in the second data buffer 34. Thereafter, the latched data is output as data. On the other hand, the latched data is subjected to data decision in the second data buffer 34. The decision signal HIT is output on the basis of a result of the decision, and the decision signal HIT is sent out to the AAS circuit 35.

In the present embodiment, two bits in the multi-value compressed pair are compressed to one bit by the data conversion circuit 32A as heretofore described. As a result, the size (128 bits) of each data buffer circuit 420$_i$ (i=0, ..., 15) in the second data buffer 34A can be made equal to half of the size (256 bits) of each data buffer circuit in the second data buffer 34 according to the first to fourth embodiments. In addition, in the first to fourth embodiments, one set of the first to fourth data decision circuits is provided for each data buffer circuit 420$_i$ (i=0, ..., 15). In the present embodiment, however, the decision circuits are used in common. As compared with the first to fourth embodiments, therefore, the area of the second data buffer can be made small.

If a write object bit is not present, the address is skipped to an address where a write object bit is present in the same way as the first to fourth embodiments. According to the present embodiment, therefore, the automatic write operation time can be made as short as possible.

APPLICATION EXAMPLE

Hereafter, an example in which a NOR-type flash memory 100 having the configuration and function described in the embodiments is mounted on a semiconductor chip will be described.

Figure 21:
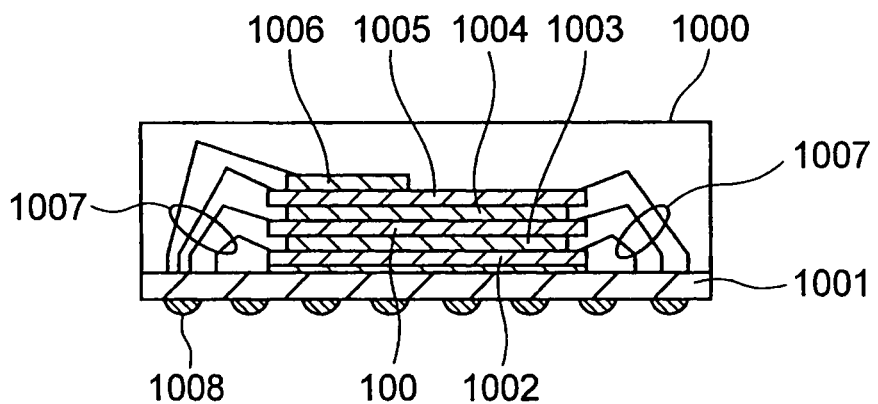
FIG. 21 is a sectional view showing an example of a semiconductor chip having a NOR flash memory in an application example.

FIG. 21 is a sectional view showing an example of a semiconductor chip (MCP: Multi Chip Package) 1000 including the NOR-type flash memory 100 according to the application example.

In the semiconductor chip 1000, a NAND-type flash memory 1002, a spacer 1003, the NOR-type flash memory 100, a spacer 1004, a PSRAM (Pseudo Static Random Access Memory) 1005, and a controller 1006 stacked on a substrate 1001 successively are mounted in the same package.

The NAND-type flash memory 1002 includes, for example, a plurality of memory cells capable of storing multi-value data. The semiconductor chip 1000 may have a configuration which uses an SDRAM (Synchronous Dynamic Random Access Memory) instead of the PSRAM.

According to the use of the memory system, the NAND type flash memory 1002 among the memories can be used as, for example, a data storage memory. The NOR-type flash memory 100 is used as, for example, a program storage memory. The PSRAM 1005 is used as, for example, a working memory.

The controller 1006 conducts data input-output control and data management mainly on the NAND-type flash memory 1002. The controller 1006 has an ECC correction circuit (not illustrated). The ECC correction circuit adds an error correction code (ECC) when writing data, and conducts analysis and processing of the error correction code when reading data as well.

The NAND-type flash memory 1002, the NOR-type flash memory 100, the PSRAM 1005 and the controller 1006 are bonded to the substrate 1001 by wires 1007.

Solder balls 1008 provided on the back of the substrate 1001 are electrically connected to the wires 1007, respectively. As for the package shape, for example, a surface mounting type BGA (Ball Grid Array) including the solder balls 1008 arranged two-dimensionally is adopted.

An ECC correction circuit 11 in a first example may be provided in the controller 1006 as already described, or may be provided in the NOR-type flash memory 100. In this case, the NOR-type flash memory 100 and the NAND-type flash memory 1002 may share the ECC correction circuit, or the NOR-type flash memory 100 and the NAND-type flash memory 1002 may have different ECC correction circuits. The ECC correction circuit 11 may be provided independently outside the controller 1002.

The case where the semiconductor chip 1000 is applied to a portable telephone which is an example of electronic devices will now be described.

Figure 22:
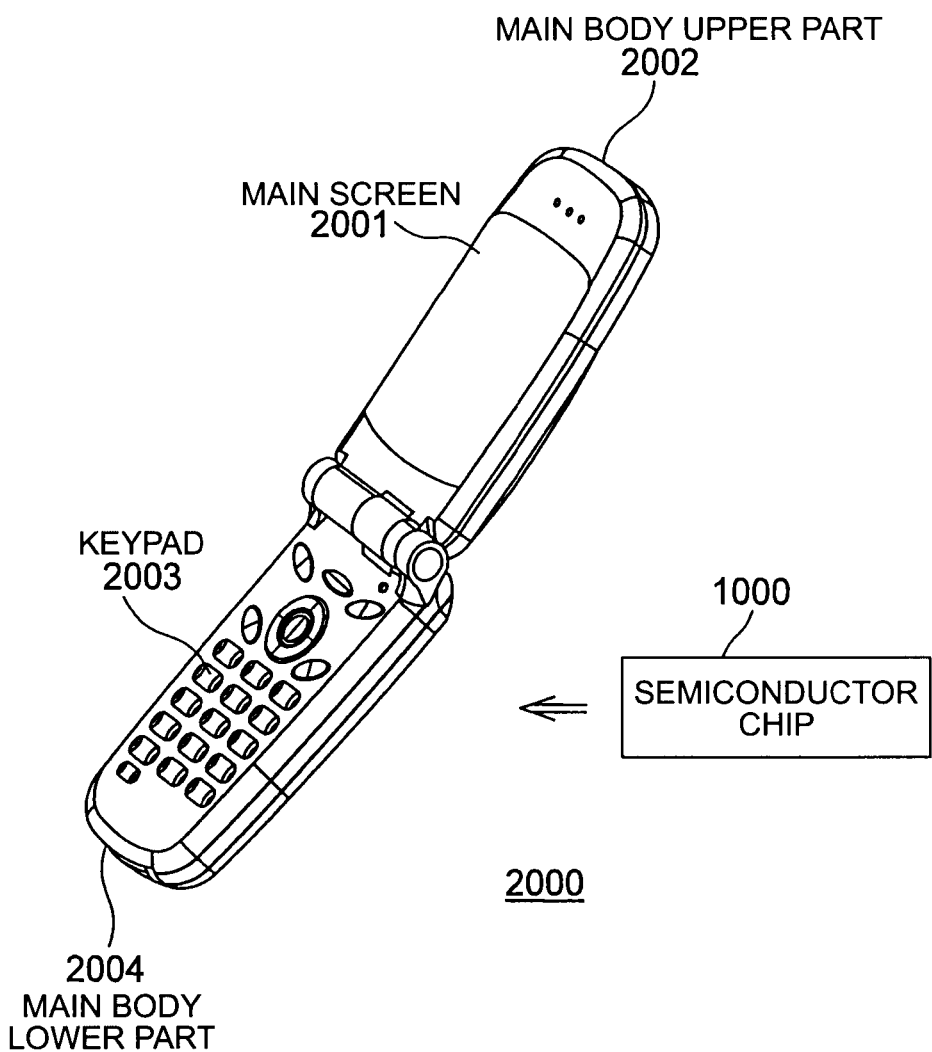
FIG. 22 is a schematic diagram showing a portable telephone incorporating a semiconductor chip having a NOR flash memory in an application example.

FIG. 22 is a diagram showing a portable telephone having the semiconductor chip 1000 mounted therein. As shown in FIG. 22, a portable telephone 2000 includes a main body upper part 2002 having a main screen 2001, and a main body lower part 2004 having a keypad 2003. The semiconductor chip 1000 is mounted on the portable telephone 2000.

A CPU (not illustrated) mounted on the portable telephone 2000 accesses the semiconductor chip 1000 via an interface (not illustrated) and conducts transfer of data or the like.

The portable telephone 2000 uses, for example, the NAND-type flash memory 1002 as a storage area for user data and uses the NOR-type flash memory 100 as a storage area for programs such as firmware.

In such a memory system, the NOR-type flash memory 100 is required to conduct a fast write operation. On the other hand, the data amount of programs to be stored tends to increase as the function of application software becomes high.

In the NOR-type flash memory 100 according to the application example, as described above, memory cells capable of multi-value data are provided. Furthermore, if a write object bit is not present, the address is skipped to an address where a write object bit is present. Both the above-described two problems can be solved.

The semiconductor chip 1000 can be applied to various electronic devices such as a personal computer, a digital still camera and a PDA, besides the portable telephone.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A non-volatile semiconductor storage device comprising:
   a memory cell array configured to include a plurality of non-volatile memory cells;
   an address search circuit configured to search for write object data and output an address where the write object data is present, when writing data into the non-volatile memory cells;
   a control circuit configured to exercise control to write the write object data into the non-volatile memory cells in accordance with the address output from the address search circuit; and
   a data buffer configured to retain input data and have a decision function of making a decision whether the write object data is present in the input data,
   wherein on the basis of a result of the decision made by the data buffer, the address search circuit outputs the address where the write object data is present.

2. The non-volatile semiconductor storage device according to claim 1, further comprising a verify data control circuit configured to make a verify decision after the writing,
   wherein as for data having a verify decision object bit, the verify control circuit inverts the verify data and outputs a result to the data buffer, whereas as for a verify decision non-object bit and a bit which has passed the verify decision once, the verify control circuit outputs pass data to the data buffer.

3. The non-volatile semiconductor storage device according to claim 1, wherein
   the non-volatile memory cells is capable of storing four-value level data, and
   the control circuit exercises control to write data of two levels obtained by excepting data of a level which is highest in threshold voltage and a level which is lowest in threshold voltage from the four-value level data into the non-volatile memory cells simultaneously.

4. A non-volatile semiconductor storage device comprising:
   a memory cell array configured to include a plurality of non-volatile memory cells;

an address search circuit configured to search for write object data and output an address where the write object data is present, when writing data into the non-volatile memory cells;

a control circuit configured to exercise control to write the write object data into the non-volatile memory cells in accordance with the address output from the address search circuit;

a first data buffer configured to retain input data;

a data conversion circuit configured to convert input data retained by the first data buffer, in accordance with the write object data; and a second data buffer configured to retain input data obtained by the conversion in the data conversion circuit and have a decision function of making a decision whether the write object data is present in the retained input data, wherein on the basis of a result of the decision made by the second data buffer, the address search circuit outputs the address where the write object data is present.

5. The non-volatile semiconductor storage device according to claim 4, further comprising a verify data control circuit configured to make a verify decision after the writing, wherein as for data having a verify decision object bit, the verify control circuit inverts the verify data and outputs a result to the data buffer, whereas as for a verify decision non-object bit and a bit which has passed the verify decision once, the verify control circuit outputs pass data to the data buffer.

6. The non-volatile semiconductor storage device according to claim 1, wherein the non-volatile memory cells is capable of storing four-value level data, and the control circuit exercises control to write data of two levels obtained by excepting data of a level which is highest in threshold voltage and a level which is lowest in threshold voltage from the four-value level data into the non-volatile memory cells simultaneously.

7. A non-volatile semiconductor storage device comprising:

a memory cell array configured to include a plurality of non-volatile memory cells;

an address search circuit configured to search for write object data and output an address where the write object data is present, when writing data into the non-volatile memory cells;

a control circuit configured to exercise control to write the write object data into the non-volatile memory cells in accordance with the address output from the address search circuit;

a first data buffer configured to retain input data;

a data conversion circuit configured to conduct multi-value compression and conversion on input data retained by the first data buffer, in accordance with the write object data, and output first compressed data obtained by further compressing the converted data to half and second compressed data which is remaining half; and a second data buffer configured to retain the first compressed data output from the data conversion circuit and have a decision function of making a decision whether the write object data is present in the first compressed data, wherein on the basis of a result of the decision made by the second data buffer, the address search circuit outputs the address where the write object data is present.

8. The non-volatile semiconductor storage device according to claim 7, further comprising a write data mask circuit configured to operate on the basis of a data pattern signal indicating a kind of the write object data, the first compressed data retained by the second data buffer, and the second compressed data output from the data conversion circuit, output the first compressed data retained by the second data buffer without masking the first compressed data when the first compressed data is the write object data, and mask the first compressed data in output when the first compressed data is not the write object data, wherein on the basis of the output of the write data mask circuit and the address output from the address search circuit, writing is performed.

9. The non-volatile semiconductor storage device according to claim 7, wherein the non-volatile memory cells is capable of storing four-value level data, and the control circuit exercises control to write data of two levels obtained by excepting data of a level which is highest in threshold voltage and a level which is lowest in threshold voltage from the four-value level data into the non-volatile memory cells simultaneously.

10. The non-volatile semiconductor storage device according to claim 9, further comprising:

a verifying sense amplifier configured to perform verifying readout; and a sense amplifier data mask circuit configured to operate on the basis of an output of the verifying sense amplifier, the second compressed data, and the data pattern signal, and mask an output of the verifying sense amplifier to prevent verification from being performed only for data having no verify decision object bit.

11. The non-volatile semiconductor storage device according to claim 9, besides retaining the first compressed data, the second data buffer makes a decision whether the write object data is present in the first compressed data on the basis of the first and second compressed data, sends a decision signal to the address search circuit on the basis of a result of the decision and a data pattern signal indicating a kind of the write object data, and causes the address search circuit to output the address where the write object data is present.

* * * * *